(12) United States Patent
Yano et al.

(10) Patent No.: US 8,725,932 B2
(45) Date of Patent: May 13, 2014

(54) MEMORY SYSTEM AND METHOD OF CONTROLLING MEMORY SYSTEM

(75) Inventors: Hirokuni Yano, Tokyo (JP); Hajime Yamazaki, Tokyo (JP); Hironobu Miyamoto, Kanagawa (JP); Shinji Yonezawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 132 days.

(21) Appl. No.: 13/063,255

(22) PCT Filed: Dec. 28, 2009

(86) PCT No.: PCT/JP2009/071920
§ 371 (c)(1),
(2), (4) Date: Mar. 10, 2011

(87) PCT Pub. No.: WO2010/074353
PCT Pub. Date: Jul. 1, 2010

(65) Prior Publication Data
US 2011/0173380 A1    Jul. 14, 2011

(30) Foreign Application Priority Data
Dec. 27, 2008    (JP) ................................. 2008-335559

(51) Int. Cl.
*G06F 12/00*    (2006.01)
*G06F 12/02*    (2006.01)

(52) U.S. Cl.
CPC .... *G06F 12/0246* (2013.01); *G06F 2212/2022* (2013.01); *G06F 2212/72* (2013.01); *G06F 2212/7207* (2013.01)
USPC ............ 711/103; 711/154; 711/162; 707/682

(58) Field of Classification Search
USPC ......................................................... 711/103
See application file for complete search history.

(56) References Cited

U.S. PATENT DOCUMENTS 6,591,329 B1 *   7/2003   Kakinuma et al. ............ 711/103
6,879,528 B2     4/2005   Takeuchi et al.
(Continued)

FOREIGN PATENT DOCUMENTS

JP    2004-152301 A    5/2004
JP    2004 192789      7/2004
(Continued)

OTHER PUBLICATIONS

U.S. Appl. No. 12/884,844, filed Sep. 17, 2010, Yano, et al.
(Continued)

*Primary Examiner* — Arpan P. Savla
*Assistant Examiner* — Gautam Sain
(74) *Attorney, Agent, or Firm* — Oblon, Spivak, McClelland, Maier & Neustadt, L.L.P.

(57) ABSTRACT

A first log indicating that a system is running is recorded in a second storage unit before a first difference log is recorded in the second storage unit after system startup, and a second log indicating that the system halts is recorded in the second storage unit following the difference log, at the time of normal system halt, and it is judged whether normal system halt has been performed or an incorrect power-off sequence has been performed last time, based on a recorded state of the first and second logs in the second storage unit, at the time of system startup, thereby detecting an incorrect power-off easily and reliably.

24 Claims, 19 Drawing Sheets

(56) References Cited

U.S. PATENT DOCUMENTS

| | | |
|---|---|---|
| 7,016,226 B2 | 3/2006 | Shibata et al. |
| 7,120,052 B2 | 10/2006 | Shibata et al. |
| 7,315,471 B2 | 1/2008 | Shibata et al. |
| 7,443,724 B2 | 10/2008 | Shibata et al. |
| 7,593,260 B2 | 9/2009 | Shibata et al. |
| 7,668,846 B1* | 2/2010 | Ghemawat et al. ........... 707/648 |
| 7,782,670 B2 | 8/2010 | Shibata et al. |
| 7,813,174 B2 | 10/2010 | Shibata et al. |
| 7,814,057 B2 | 10/2010 | Kathuria et al. |
| 7,904,640 B2 | 3/2011 | Yano et al. |
| 2003/0163594 A1 | 8/2003 | Aasheim et al. |
| 2004/0083405 A1 | 4/2004 | Chang et al. |
| 2004/0170056 A1 | 9/2004 | Shibata et al. |
| 2005/0204115 A1* | 9/2005 | Matsuno et al. ............... 711/203 |
| 2006/0224636 A1* | 10/2006 | Kathuria et al. ............... 707/200 |
| 2008/0005192 A1 | 1/2008 | Jung et al. |
| 2009/0222616 A1 | 9/2009 | Yano et al. |
| 2009/0222617 A1 | 9/2009 | Yano et al. |
| 2009/0222628 A1 | 9/2009 | Yano et al. |
| 2009/0222629 A1 | 9/2009 | Yano et al. |
| 2009/0222636 A1 | 9/2009 | Yano et al. |
| 2009/0228642 A1 | 9/2009 | Yano et al. |
| 2009/0235015 A1 | 9/2009 | Hatsuda et al. |
| 2009/0235016 A1 | 9/2009 | Yano et al. |
| 2009/0240871 A1 | 9/2009 | Yano et al. |
| 2009/0241010 A1 | 9/2009 | Yano et al. |
| 2009/0248964 A1 | 10/2009 | Yano et al. |
| 2010/0037009 A1 | 2/2010 | Yano et al. |
| 2010/0037010 A1 | 2/2010 | Yano et al. |
| 2010/0037011 A1 | 2/2010 | Yano et al. |
| 2010/0037012 A1 | 2/2010 | Yano et al. |
| 2010/0042773 A1* | 2/2010 | Yeh ............................... 711/103 |
| 2010/0049907 A1 | 2/2010 | Kitsunai et al. |
| 2010/0070735 A1* | 3/2010 | Chen et al. .................... 711/206 |
| 2010/0077266 A1 | 3/2010 | Kanno et al. |
| 2010/0138591 A1 | 6/2010 | Yano et al. |
| 2010/0146228 A1 | 6/2010 | Kanno et al. |
| 2010/0153626 A1 | 6/2010 | Yano et al. |
| 2010/0199025 A1 | 8/2010 | Nanjou et al. |
| 2010/0205353 A1 | 8/2010 | Miyamoto |
| 2010/0205391 A1 | 8/2010 | Miyamoto |
| 2010/0223424 A1 | 9/2010 | Kitsunai et al. |
| 2010/0277980 A1 | 11/2010 | Shibata et al. |
| 2010/0281204 A1 | 11/2010 | Yano et al. |
| 2010/0312948 A1 | 12/2010 | Yano et al. |
| 2010/0313084 A1 | 12/2010 | Hida et al. |
| 2011/0022784 A1 | 1/2011 | Yano et al. |

FOREIGN PATENT DOCUMENTS

| | | |
|---|---|---|
| JP | 2005 24300 | 9/2005 |
| JP | 2005-242897 A | 9/2005 |
| WO | 2009 028281 | 3/2009 |
| WO | 2009 041153 | 4/2009 |
| WO | 2009 084724 | 7/2009 |
| WO | 2009 110126 | 9/2009 |
| WO | 2009 110303 | 9/2009 |

OTHER PUBLICATIONS

U.S. Appl. No. 13/238,675, filed Sep. 21, 2011, Norimatsu, et al.
U.S. Appl. No. 13/052,146, filed Mar. 21, 2011, Ootsuka, et al.
U.S. Appl. No. 12/529,145, filed Aug. 28, 2009, Yano, et al.
U.S. Appl. No. 12/529,127, filed Aug. 28, 2009, Yano, et al.
U.S. Appl. No. 12/529,129, filed Aug. 31, 2009, Yano, et al.
U.S. Appl. No. 12/529,227, filed Aug. 31, 2009, Yano, et al.
U.S. Appl. No. 12/529,228, filed Aug. 31, 2009, Yano, et al.
U.S. Appl. No. 12/529,235, filed Aug. 31, 2009, Yano, et al.
U.S. Appl. No. 12/984,337, filed Jan. 4, 2011, Yano, et al.
International Search Report issued Apr. 13, 2010 in PCT/JP09/071920 filed Dec. 28, 2009.
U.S. Appl. No. 13/326,872, filed Dec. 15, 2011, Hirao, et al.
U.S. Appl. No. 13/328,471, filed Dec. 16, 2011, Yano, et al.
U.S. Appl. No. 13/328,420, filed Dec. 16, 2011, Yonezawa, et al.
Office Action issued Jan. 8, 2013, in Japanese Patent Application No. 2008-335559 (with English translation).
Combined Chinese Office Action and Search Report issued Feb. 20, 2013 in Patent Application No. 2009801354138 with English Translation and English Translation of Category of Cited Documents.
U.S. Appl. No. 13/609,991, filed Sep. 11, 2012, Hirao, et al.
Extended European Search Report issued Nov. 29, 2012, in European Patent Application No. 09835128.1.
U.S. Appl. No. 13/599,087, filed Aug. 30, 2012, Yonezawa, et al.
Japanese Office Action Issued Apr. 2, 2013 in Patent Application No. 2008-335559 (with English translation).

* cited by examiner

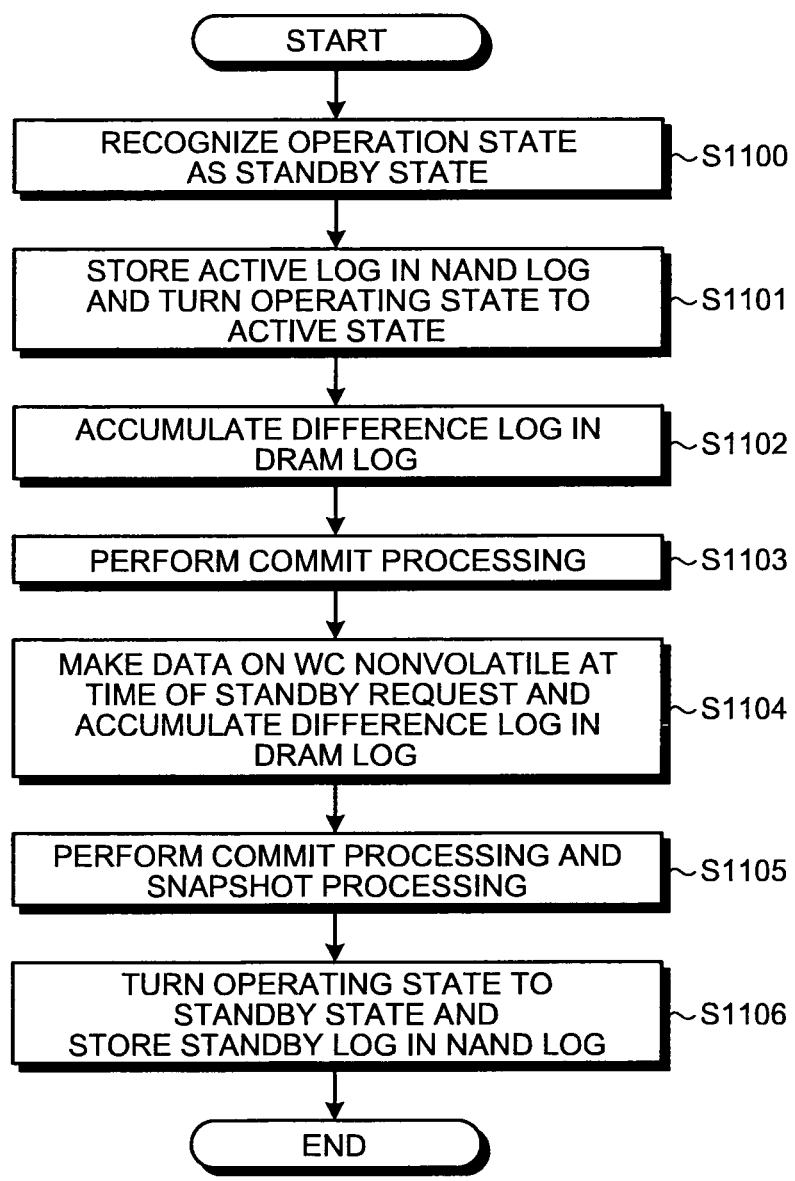

AFTER NORMAL POWER-OFF

AFTER INCORRECT POWER-OFF (THERE IS ACTIVE LOG BUT NO STANDBY LOG)

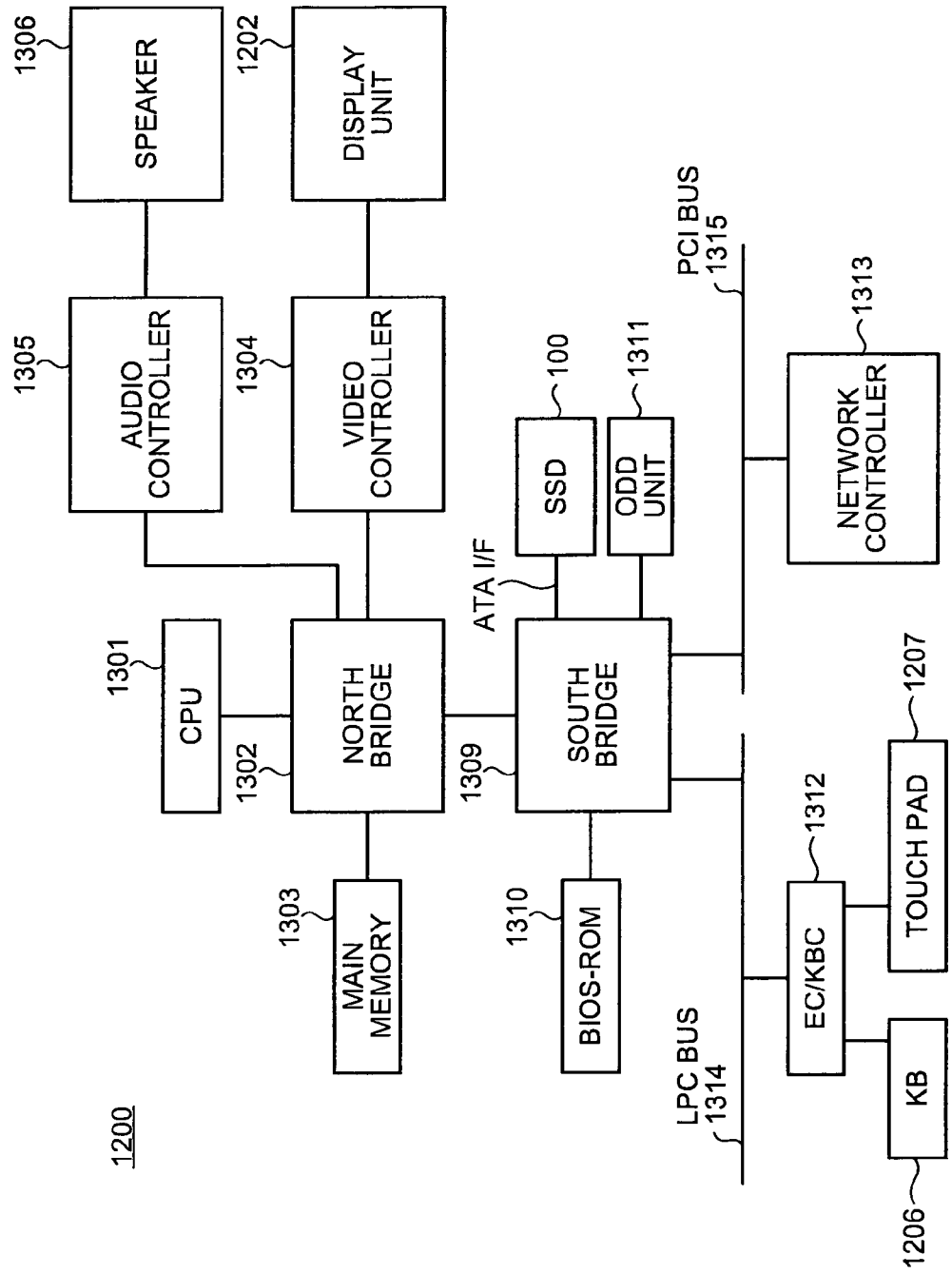

MEMORY SYSTEM AND METHOD OF CONTROLLING MEMORY SYSTEM

TECHNICAL FIELD

The present invention relates to a memory system that includes a nonvolatile semiconductor memory and a method of controlling the memory system.

BACKGROUND ART

Some personal computers (PC) employ a hard disk device as a secondary storage device. In such PCs, a technology is known for backing up data that has been stored in the hard disk device to prevent the data from becoming invalid because of some failure. For example, when act of changing data in the hard disk device is detected, a snapshot as a backup copy of the data before the change is taken and a log of changes made to the data is generated. Then, processing for taking a new snapshot, invalidating a log taken in the past before the new snapshot was taken, and generating a new log is repeated at every specific time (for example, see Patent Document 1: Specification of United States Patent Application Laid-open No. 2006/0224636). In case data becomes invalid due to some reason, the data can be restored by referring to the snapshot and the log.

In recent years, a capacity of a NAND-type flash memory as a nonvolatile semiconductor storage device has been increased dramatically. As a result, a Solid State Drive (SSD) as a memory system mounted with a NAND-type flash memory attracts attention. The flash memory has advantages such as high speed and lightweight compared with a magnetic disk device. However, the technology disclosed in Patent Document 1 cannot be applied to backup of data stored in such PC having the NAND-type flash memory as the secondary storage device as in the case of backup of data stored in the PC having the hard disk device as the secondary storage device. This is because a multi-value memory technology in which a plurality of pieces of data (multi-value data) equal to or larger than 2 bits can be stored in one memory cell is employed to increase the capacity of the NAND-type flash memory (for example, see Patent Document 2: Japanese Patent Application Laid-open No. 2004-192789).

DISCLOSURE OF INVENTION

One aspect of this invention is to provide a memory system comprising: a memory system comprising: a first storage unit that is volatile; a second storage unit that is nonvolatile and is connected to the first storage unit; a read/write control unit that performs data reading from the second storage unit and data writing to the second storage unit based on a management table in which a logical address is associated with a data storage position in the second storage unit; a log control unit that transfers the management table to the first storage unit, and when an event to update the management table on the first storage unit occurs, stores difference information before and after update of the management table as a difference log into the first storage unit; a log reflecting unit that executes commit processing for storing the difference log into the second storage unit and reflecting the difference log in the management table stored in the first storage unit when a first condition is established; an operating state managing unit that stores a first log into the second storage unit before the log reflecting unit stores the difference log into the second storage unit after system startup, and stores a second log into the second storage unit when normal system halt is performed; and a management-information restoring unit that detects at least one of the first log, the difference log, and the second log stored in the second storage unit and judges whether normal system halt has been performed.

BRIEF DESCRIPTION OF DRAWINGS

FIG. 19 is a flowchart illustrating a procedure of storing an Active log, a Standby log, and a difference log.

FIG. 24 is a diagram of a system configuration example of the PC on which the SSD is mounted.

BEST MODE(S) FOR CARRYING OUT THE INVENTION

Figure 1:
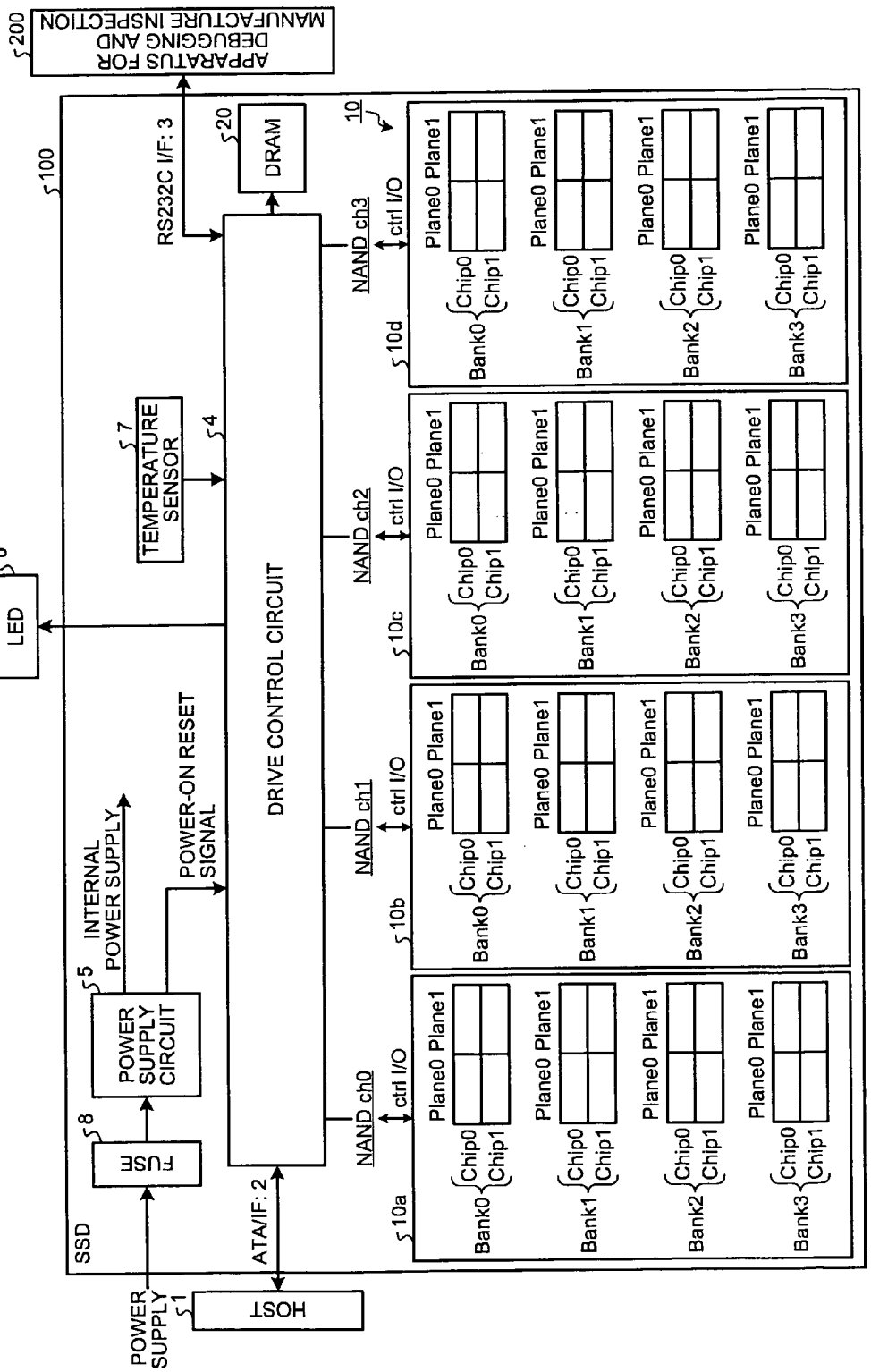
FIG. 1 is a block diagram of a configuration example of an SSD.

A memory cell configuring a multi-value memory has a field effect transistor structure having a stacked gate structure in which a gate insulating film, a floating gate electrode, an inter-gate insulating film, and a control gate electrode are stacked in order on a channel region and a plurality of threshold voltages can be set according to the number of electrons accumulated in the floating gate electrode. In order to make it possible to perform multi-value storage based on the plurality of threshold voltages, the distribution of a threshold voltage corresponding to one piece of data needs to be made extremely narrow.

The data recorded by the host apparatus such as the PC has both temporal locality and spatial locality. Therefore, when data is recorded, if the data is directly recorded in an address designated from the outside, rewriting, i.e., erasing processing temporally concentrates in a specific area and a bias in the number of times of erasing increases. Therefore, in the memory system using a NAND-type flash memory, processing called wear leveling for equally distributing data update sections is performed. In the wear leveling processing, for example, a logical address designated by the host apparatus is translated into a physical address of the nonvolatile semiconductor memory so that the data update sections are equally distributed.

In such address translation, a storing position of data is often managed by using a management table such as an address translation table representing a correspondence relationship between a logical address (LBA) supplied from outside and a physical address indicating a position at which data is stored on a NAND-type flash memory. The management table is loaded from a nonvolatile NAND-type flash memory onto a memory such as a dynamic random access memory (DRAM) at the time of start-up, which is updated every time data is written. The correspondence relationship in the address translation table needs to be backed up, for example, by using a backup technology such as the snapshot and the log for using the correspondence relationship over a power-off.

In the SSD, even when a power off occurs unexpectedly during writing of data (even at the time of an unauthorized power off), it is necessary to maintain consistency of management information and reliably protect the data already recorded therein. Therefore, a method of easily and reliably detecting whether a normal power-off sequence has been performed or an incorrect power-off sequence has been performed is desired also in the SSD.

Exemplary embodiments of a memory system according to the present invention are explained in detail below with reference to the accompanying drawings. The present invention is not limited to these embodiments.

Embodiments of the present invention are explained below with reference to the drawings. In the following explanation, components having the same functions and configurations are denoted by the same reference numerals and signs. Redundant explanation of the components is performed only when necessary.

First, terms used in the specification are defined.

Physical page: A unit that can be collectively written and read out in a NAND-type flash memory.

Logical page: A writing and readout unit set in an SSD. The logical page is associated with one or more physical pages.

Physical block: A minimum unit that can be independently erased in the NAND-type flash memory. The physical block includes a plurality of physical pages.

Logical block: An erasing unit set in the SSD. The logical block is associated with one or more physical blocks. The logical block includes a plurality of logical pages.

Sector: A minimum access unit from a host. A sector size is, for example, 512 bytes (B).

Cluster: A management unit for managing "small data (fine grained data)" in the SSD. A cluster size is equal to or larger than the sector size and is set to be equal to a data management unit of a file system that an operating system (OS) of a host employs or a logical page size. For example, the cluster size can be set such that a size twice or larger natural number times as large as the cluster size is the logical page size.

Track: A management unit for managing "large data (coarse grained data)" in the SSD. A track size is set such that a size twice or larger natural number times as large as the cluster size is the track size. For example, the track size can be set equal to the logical block size.

Free block (FB): A logical block which does not include valid data therein and for which a use is not allocated. The free block includes the following two types, i.e., a complete free block (CFB) and a fragment free block (FFB).

Complete free block (CFB): A free block on which an erasing operation needs to be performed for reuse. After performing the erasing operation, writing can be performed from a logical page positioned at the top of a logical block.

Fragment free block (FFB): A free block in which a logical page with no data written therein remains and which can be reused without performing the erasing operation. Writing can be performed in the remaining logical page with no data written therein.

Bad block (BB): A physical block on the NAND-type flash memory that cannot be used as a storage area because of a large number of errors. For example, a physical block for which the erasing operation is not normally finished is registered as the bad block BB.

Writing efficiency: A statistical value of an erasing amount of the logical block with respect to a data amount written from the host in a specific period. As the writing efficiency is smaller, a wear degree of the NAND-type flash memory is smaller.

Valid cluster: A cluster that stores latest data (cluster-sized data) corresponding to a logical address.

Invalid cluster: A cluster that stores non-latest data (cluster-sized data) not to be referred as a result that data having an identical logical address is written in a different location.

Valid track: A track that stores latest data (track-sized data) corresponding to a logical address.

Invalid track: A track that stores non-latest data (track-sized data) not to be referred as a result that data having an identical logical address is written in a different location.

Multi level cell (MLC) mode: Mode in which writing is normally performed using an upper page and a lower page in a NAND-type flash memory capable of multi-valued storage. A logical block of the MLC mode is configured by associating with one or more physical blocks used in the MLC mode.

Pseudo single level cell (SLC) mode: Mode in which writing is performed using only a lower page in a NAND-type flash memory capable of multi-valued storage. A logical block of the pseudo SLC mode is configured by associating with one or more physical blocks used in the pseudo SLC mode. Even a physical block used once in the pseudo SLC mode can be used in the MLC mode after the erasing operation.

First Embodiment

FIG. 1 is a block diagram of a configuration example of an SSD 100. The SSD 100 is connected to a host device 1 (hereinafter, host 1) such as a PC or a central processing unit (CPU) core via a memory connection interface such as an advanced technology attachment interface (ATA I/F) 2 and functions as an external memory of the host 1. The SSD 100 can transmit data to and receive data from an apparatus for debugging and manufacture inspection 200 via a communication interface 3 such as an RS232C I/F. The SSD 100 includes a NAND-type flash memory (hereinafter, NAND memory) 10 as a nonvolatile semiconductor memory, a drive control circuit 4 as a controller, a DRAM 20 as a volatile semiconductor memory, a power supply circuit 5, a light-emitting diode (LED) for state display 6, a temperature sensor 7 that detects a temperature in a drive, and a fuse 8.

The power supply circuit 5 generates a plurality of different internal direct current (DC) power supply voltages from external DC power supplied from a power supply circuit on the host 1 side and supplies these internal DC power supply voltages to respective circuits in the SSD 100. The power supply circuit 5 detects a rising edge of an external power supply, generates a power-on reset signal, and supplies the power-on reset signal to the drive control circuit 4. The fuse 8 is provided between the power supply circuit on the host 1 side and the power supply circuit 5 in the SSD 100. When an overcurrent is supplied from an external power supply circuit, the fuse 8 is disconnected to prevent malfunction of the internal circuits.

In this case, the NAND memory 10 includes four parallel operation elements 10a to 10d that perform four parallel operations. The parallel operation elements 10a to 10d are connected to the drive control circuit 4 by four channels (ch0 to ch3). Each of the parallel operation elements 10a to 10d includes a plurality of banks (in this case, four banks (Bank0 to Bank3)) capable of performing bank interleave. Each bank includes a plurality of NAND memory chips (in this case, two memory chips (Chip0 and Chip1)). Each memory chip is divided into, for example, two districts of a plane 0 and a plane 1 each of which includes a plurality of physical blocks. The plane 0 and the plane 1 include peripheral circuits independent from each other (e.g., a row decoder, a column decoder, a page buffer, and a data cache) and can simultaneously perform erasing, writing, and readout by using a double speed mode. In this manner, each NAND memory chip of the NAND memory 10 can perform the parallel operation by a plurality of channels, the bank interleave operation by a plurality of banks, and the parallel operation by the double speed mode using a plurality of planes. Each memory chip can be divided into four planes or be configured without being divided.

The DRAM 20 functions as a cache for data transfer between the host 1 and the NAND memory 10 and a memory for a work area. In the memory for the work area of the DRAM 20, a master table (snapshot) that is obtained by loading various management tables stored in the NAND memory 10 at the time of start-up or the like, log information that is a change difference of a management table, and the like are stored. A ferroelectric random access memory (FeRAM), a magnetoresistive random access memory (MRAM), a phase change random access memory (PRAM), or the like can be used instead of the DRAM 20. The drive control circuit 4 performs data transfer control between the host 1 and the NAND memory 10 via the DRAM 20 and controls the respective components in the SSD 100. The drive control circuit 4 supplies a signal for status display to the LED for state display 6. The drive control circuit 4 also has a function of receiving a power-on reset signal from the power supply circuit 5 and supplying a reset signal and a clock signal to respective units in the own circuit and the SSD 100.

Figure 2A:
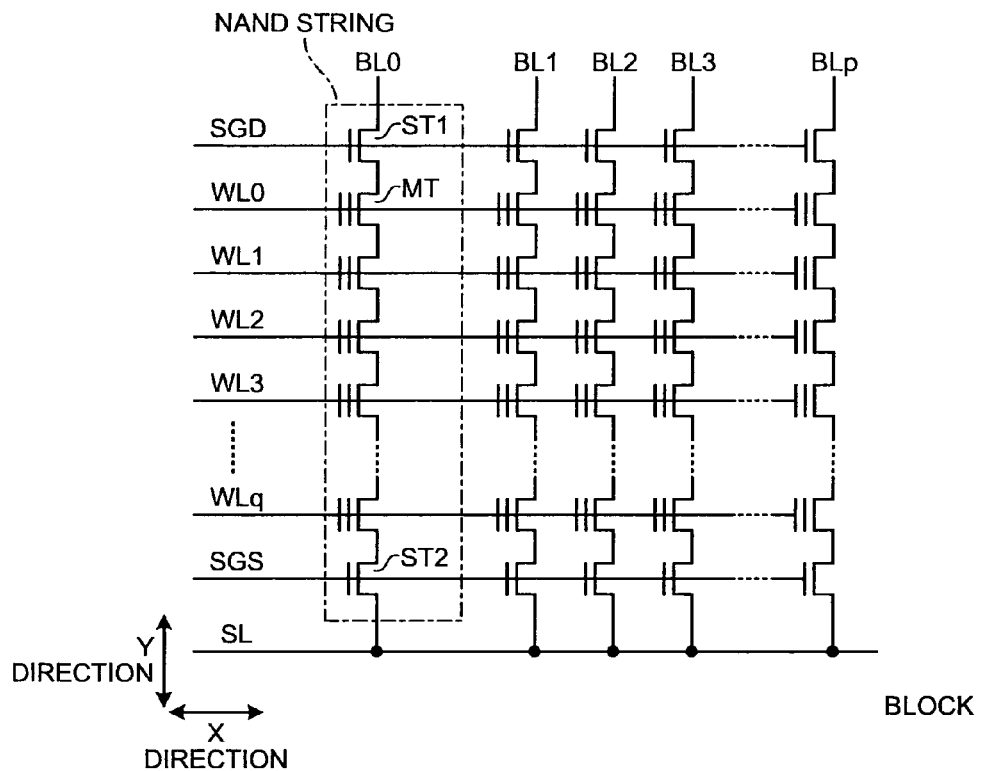
FIGS. 2A and 2B are diagrams illustrating a configuration example of one block included in a NAND memory chip and a threshold distribution in a quaternary data storage system.

Each NAND memory chip is configured by arranging a plurality of physical blocks as a unit of data erasing. FIG. 2A is an equivalent circuit diagram illustrating a configuration example of one physical block included in a NAND memory chip. Each physical block includes (p+1) NAND strings arranged in order along the X direction (p is an integer equal to or greater than 0). Selection transistors ST1 included in the respective (p+1) NAND strings are such that drains are connected to bit lines BL0 to BLp, respectively, and gates are connected to a gate line SGD in common. Moreover, selection transistors ST2 are such that sources are connected to a source line SL in common and gates are connected to a gate line SGS in common.

Each of memory cell transistors MT includes a metal oxide semiconductor field effect transistor (MOSFET) including the stacked gate structure formed on a semiconductor substrate. The stacked gate structure includes a charge storage layer (a floating gate electrode) formed on the semiconductor substrate via a gate insulating film and a control gate electrode formed on the charge storage layer via an inter-gate insulating film. In the memory cell transistors MT, a threshold voltage changes according to the number of electrons accumulated in the floating gate electrode. The memory cell transistor MT stores data according to a difference in the threshold voltage. The memory cell transistor MT can be configured to store one bit or can be configured to store multiple values (data equal to or larger than two bits).

The memory cell transistor MT is not limited to the structure having the floating gate electrode and can be the structure such as a metal-oxide-nitride-oxide-silicon (MONOS) type that can adjust a threshold by causing a nitride film interface as a charge storage layer to trap electrons. Similarly, the memory cell transistor MT of the MONOS structure can be configured to store one bit or can be configured to store multiple values (data equal to or larger than two bits).

In each of the NAND strings, (q+1) memory cell transistors MT are arranged between a source of the selection transistor ST1 and a drain of the selection transistor ST2 such that current paths thereof are connected in series. In other words, the memory cell transistors MT are connected in series in a Y direction such that adjacent ones of the memory cell transistors MT share a diffusion region (a source region or a drain region).

Control gate electrodes of the memory cell transistors MT are connected to word lines WL0 to WLq, respectively, in order from the memory cell transistor MT located on the most drain side. Therefore, a drain of the memory cell transistor MT connected to the word line WL0 is connected to the source of the selection transistor ST1. A source of the memory cell transistor MT connected to the word line WLq is connected to the drain of the selection transistor ST2.

The word lines WL0 to WLq connect the control gate electrodes of the memory cell transistors MT in common among the NAND strings in the physical block. In other words, the control gate electrodes of the memory cell transistors MT present in an identical row in the block are connected to an identical word line WL. (p+1) memory cell transistors MT connected to the identical word line WL are treated as one page (physical page). Data writing and data readout are performed by each physical page.

The bit lines BL0 to BLp connect drains of the selection transistors ST1 in common among the blocks. In other words, the NAND strings present in an identical column in a plurality of blocks are connected to an identical bit line BL.

Figure 2B:
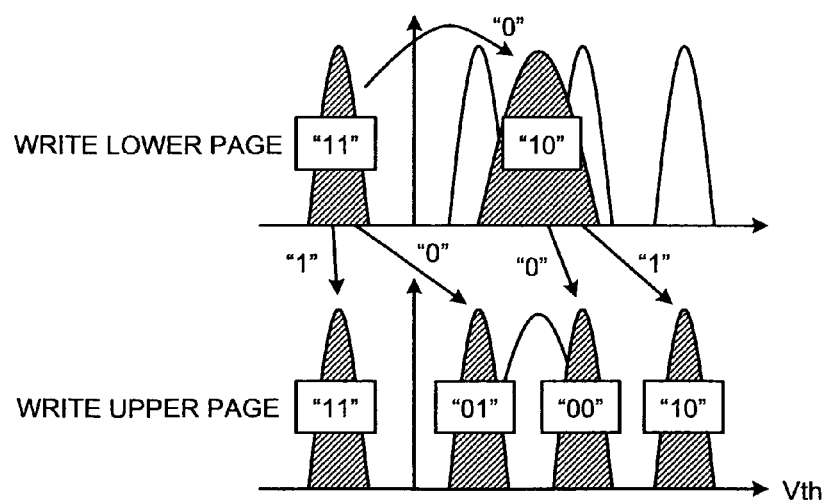

FIG. 2B is a schematic diagram of a threshold distribution, for example, in a quaternary data storage mode for storing two bits in one memory cell transistor MT. In the quaternary data storage mode, any one of quaternary data "xy" defined by upper page data "x" and lower page data "y" can be stored in the memory cell transistor MT.

As the quaternary data "xy", for example, data "11", "01", "00", and "10" are allocated in order of threshold voltages of the memory cell transistor MT. The data "11" is an erased state in which the threshold voltage of the memory cell transistor MT is negative. The rule of allocation of data is not limited thereto. The configuration can be such that three or more bits are stored in one memory cell transistor MT.

In a lower page writing operation, the data "10" is selectively written in the memory cell transistor MT having the data "11" (in the erased state) according to the writing of the lower bit data "y". A threshold distribution of the data "10" before upper page writing is located about in the middle of threshold distributions of the data "01" and the data "00" after the upper page writing and can be broader than a threshold distribution after the upper page writing. In an upper page writing operation, writing of upper bit data "x" is selectively applied to a memory cell of the data "11" and a memory cell of the data "10". The data "01" and the data "00" are written in the memory cells. In the pseudo SLC mode, writing is performed using only the lower page. The lower page writing is faster than the upper page writing.

Figure 3:
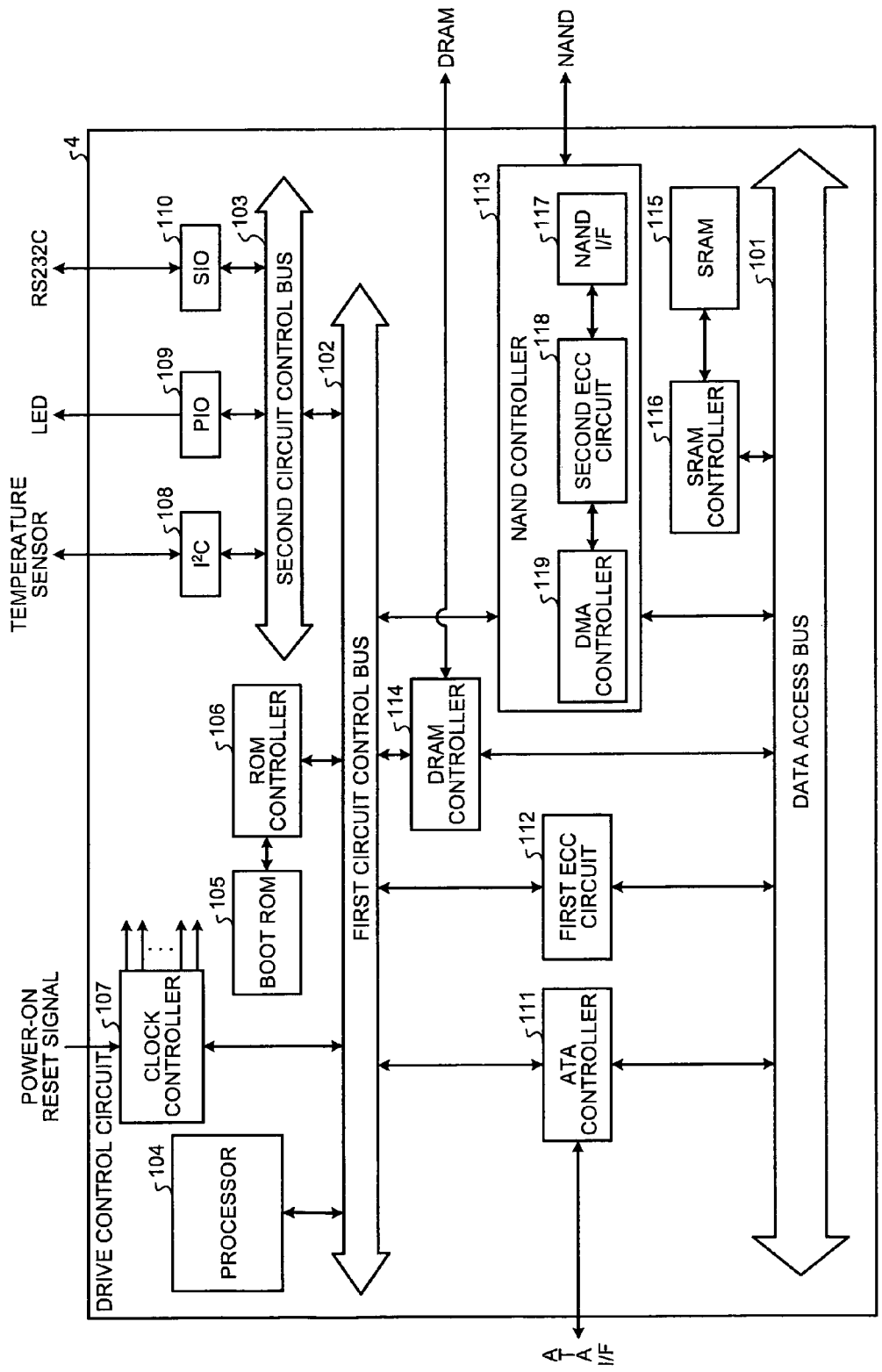
FIG. 3 is a block diagram of a hardware internal configuration example of a drive control circuit.

FIG. 3 is a block diagram of a hardware internal configuration example of the drive control circuit 4. The drive control circuit 4 includes a data access bus 101, a first circuit control bus 102, and a second circuit control bus 103. A processor 104 that controls the entire drive control circuit 4 is connected to the first circuit control bus 102. A boot ROM 105, in which a boot program for booting respective management programs (FW: firmware) stored in the NAND memory 10 is stored, is connected to the first circuit control bus 102 via a ROM controller 106. A clock controller 107 that receives the power-on rest signal from the power supply circuit 5 shown in FIG. 1 and supplies a reset signal and a clock signal to the respective units is connected to the first circuit control bus 102.

The second circuit control bus 103 is connected to the first circuit control bus 102. An I$^2$C circuit 108 for receiving data from the temperature sensor 7 shown in FIG. 1, a parallel IO (PIO) circuit 109 that supplies a signal for status display to the LED for state display 6, and a serial IO (SIO) circuit 110 that controls the RS232C I/F 3 are connected to the second circuit control bus 103.

An ATA interface controller (ATA controller) 111, a first error checking and correction (ECC) circuit 112, a NAND controller 113, and a DRAM controller 114 are connected to both of the data access bus 101 and the first circuit control bus 102. The ATA controller 111 transmits data to and receives data from the host 1 via the ATA interface 2. A static random access memory (SRAM) 115 used as a data work area and a firmware expansion area is connected to the data access bus 101 via an SRAM controller 116. When the firmware stored in the NAND memory 10 is started, the firmware is transferred to the SRAM 115 by the boot program stored in the boot ROM 105.

The NAND controller 113 includes a NAND I/F 117 that performs interface processing for interface with the NAND memory 10, a second ECC circuit 118, and a direct memory access (DMA) controller for DMA transfer control 119 that performs access control between the NAND memory 10 and the DRAM 20. The second ECC circuit 118 performs encode of a second correction code and performs encode and decode of a first error correction code. The first ECC circuit 112 performs decode of a second error correction code. The first error correction code and the second error correction code are, for example, a Hamming code, a Bose Chaudhuri Hocquenghem (BCH) code, a Reed Solomon (RS) code, or a low density parity check (LDPC) code. Correction ability of the second error correction code is higher than correction ability of the first error correction code. A technology related to such error correction is disclosed, for example, in International Patent Application PCT/JP2008/063344 or International Patent Application PCT/JP2008/063345, and the whole content thereof is incorporated in the present application.

As shown in FIG. 1, in the NAND memory 10, the four parallel operation elements 10a to 10d are connected in parallel to the NAND controller 113 in the drive control circuit 4 via four channels (4ch) each for a plurality of bits, so that the four parallel operation elements 10a to 10d can be actuated in parallel. The NAND memory 10 of each channel is divided into four banks capable of the bank interleave, and can access to the plane 0 and the plane 1 of each memory chip simultaneously. Therefore, processing such as writing can be performed almost simultaneously on up to eight physical blocks (4 banks×2 planes) for each channel. A technology related to such bank interleave is disclosed, for example, in U.S. patent application Ser. No. 12/558,965, and the whole content thereof is incorporated in the present application.

Figure 4:
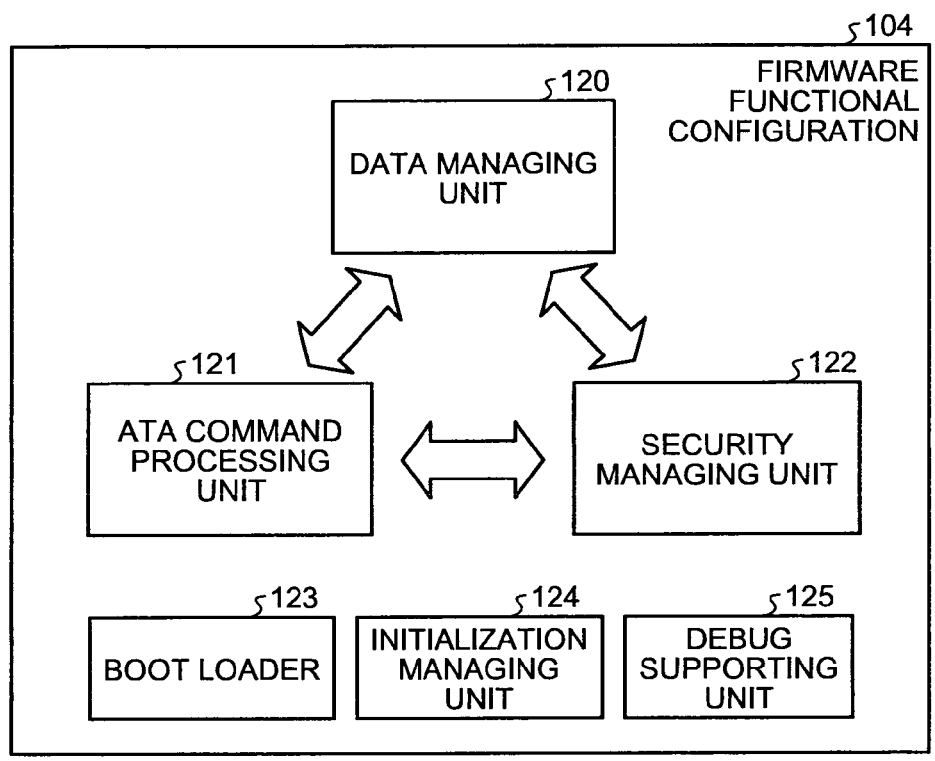
FIG. 4 is a block diagram of a functional configuration example of a processor.

FIG. 4 is a block diagram of a functional configuration example of a firmware realized by the processor 104. Functions of the firmware realized by the processor 104 are roughly classified into a data managing unit 120, an ATA-command processing unit 121, a security managing unit 122, a boot loader 123, an initialization managing unit 124, and a debug supporting unit 125.

The data managing unit 120 controls data transfer between the NAND memory 10 and the DRAM 20 and various functions concerning the NAND memory 10 via the NAND controller 113 and the first ECC circuit 112. The ATA-command processing unit 121 performs data transfer processing between the DRAM 20 and the host 1 in cooperation with the data managing unit 120 via the ATA controller 111 and the DRAM controller 114. The security managing unit 122 manages various kinds of security information in cooperation with the data managing unit 120 and the ATA-command processing unit 121.

The boot loader 123 loads, when a power supply is turned on, the management programs (firmware) from the NAND memory 10 onto the SRAM 115. The initialization managing unit 124 performs initialization of respective controllers and circuits in the drive control circuit 4. The debug supporting unit 125 processes data for debug supplied from the outside via the RS232C interface. The data managing unit 120, the ATA-command processing unit 121, and the security managing unit 122 are mainly functional units realized by the processor 104 executing various management programs stored in the SRAM 115.

In the present embodiment, functions realized by the data managing unit 120 are mainly explained. The data managing unit 120 performs, for example, provision of functions that the ATA-command processing unit 121 requests the NAND memory 10 and the DRAM 20 as storage devices (in response to various commands such as a write request, a cache flush request, and a read request from the host), management of a correspondence relation between a logical address given from the host 1 and a physical address of the NAND memory 10, protection of management information by a snapshot and a log, provision of fast and highly efficient data readout and writing functions using the DRAM 20 and the NAND memory 10, and ensuring of reliability of the NAND memory 10.

Figure 5:
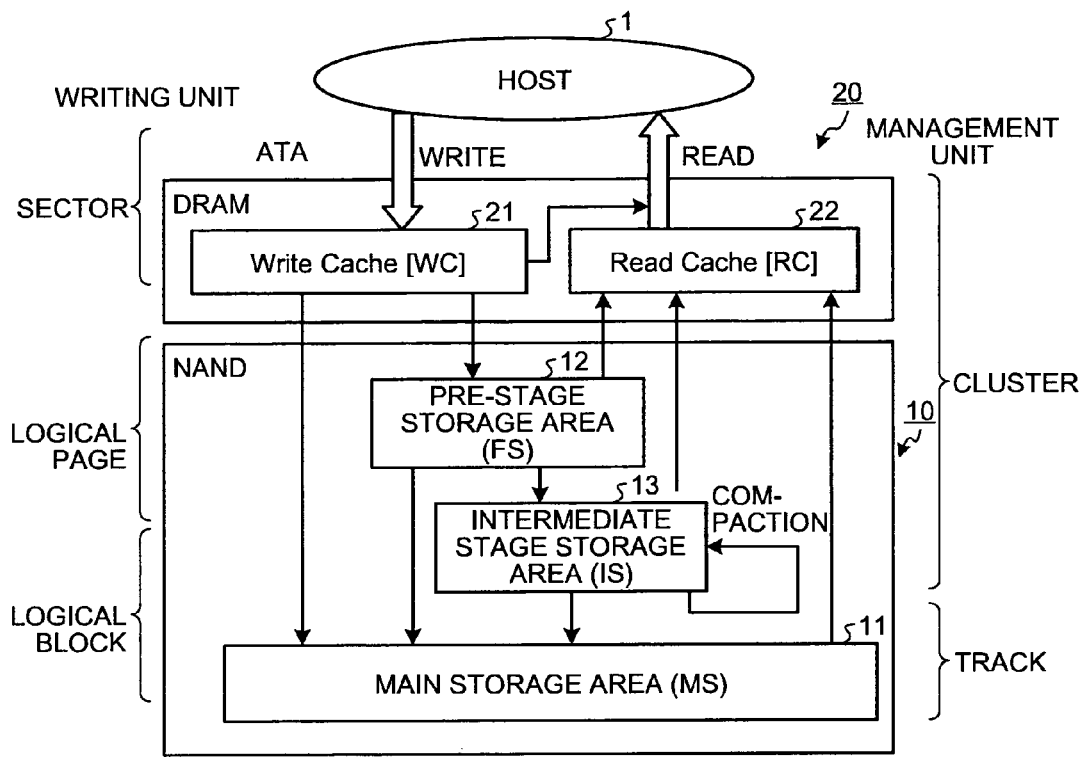
FIG. 5 is a block diagram of a functional configuration formed in a NAND memory and a dynamic random access memory (DRAM).

FIG. 5 is a diagram of functional blocks formed in the NAND memory 10 and the DRAM 20. A write cache (WC) 21 and a read cache (RC) 22 configured on the DRAM 20 are interposed between the host 1 and the NAND memory 10. The WC 21 temporarily stores therein Write data from the host 1. The RC 22 temporarily stores therein Read data from the NAND memory 10. The blocks in the NAND memory 10 are allocated to respective management areas of a pre-stage storage area (FS: Front Storage) 12, an intermediate stage storage area (IS: Intermediate Storage) 13, and a main storage area (MS: Main Storage) 11 by the data managing unit 120 in order to reduce an amount of erasing for the NAND memory 10 during writing. The FS 12 manages data from the WC 21 in cluster units, i.e., "small units" and stores small data for a short period. The IS 13 manages data overflowing from the FS 12 in cluster units, i.e., "small units" and stores small data for a long period. The MS 11 manages data from the WC 21, the FS 12, and the IS 13 in track units, i.e., "large units". A technology for managing blocks in the NAND memory 10 by allocating them in each management area in this manner is disclosed, for example, in International Patent Application PCT/JP08/073950 or International Patent Application PCT/JP08/067600, and the whole content thereof is incorporated in the present application.

Figure 6:
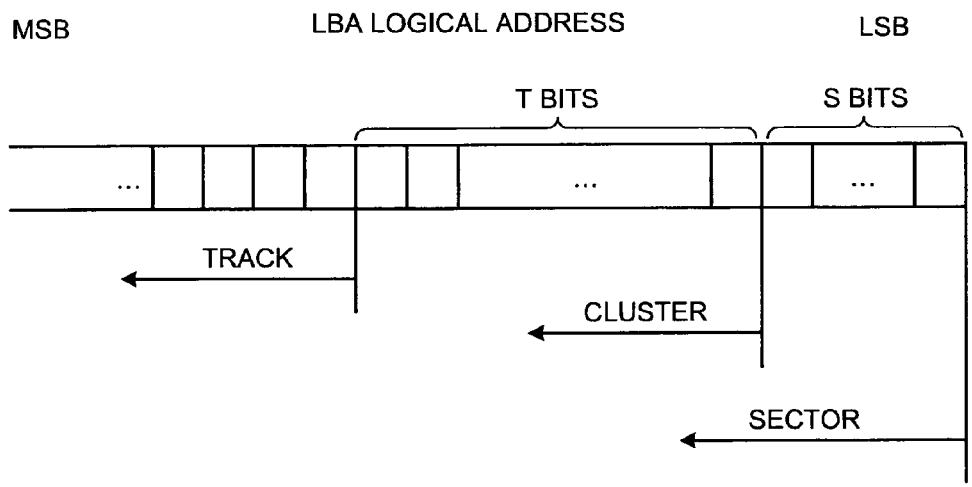
FIG. 6 is a diagram illustrating an LBA logical address.

Specific functional configurations of the respective components shown in FIG. 5 are explained in detail. When the host 1 performs Read or Write for the SSD 100, the host 1 inputs a logical block addressing (LBA) as a logical address via the ATA I/F 2. As shown in FIG. 6, the LBA is a logical address in which serial numbers from zero are attached to sectors (size: 512 B). In the present embodiment, as management units for the WC 21, the RC 22, the FS 12, the IS 13, and the MS 11, which are the components shown in FIG. 5, a cluster address formed of a bit string equal to or higher in order than a low-order (s+1)th bit of an LBA and a track address formed of a bit string equal to or higher in order than a low-order (s+t+1)th bit of an LBA are defined. In the present embodiment, the size of a track and a logical block is the same. The logical block is a virtual block associated with a plurality of physical blocks on a chip of the NAND memory 10. In the present embodiment, the logical block is associated with physical blocks for the number of parallel channels (in this case, four channels as shown in FIG. 1). In the similar manner, the logical page is associated with physical pages for four channels. The logical block is selected from physical blocks belonging to the same bank for efficiently using the bank interleave.

<Read Cache (RC) 22>

The RC 22 is an area for temporarily storing, in response to a read request from the host 1, Read data from the NAND memory 10 (the FS 12, the IS 13, and the MS 11). Data transfer to the host 1 is basically performed from the RC 22. When data writing is performed from the WC 21 to the NAND memory 10, data on the RC 22 of the same logical address is invalidated.

<Write Cache (WC) 21>

The WC 21 is an area for temporarily storing, in response to a write request from the host 1, Write data from the host 1. Data on the WC 21 is managed in cluster units, and writing and management of valid data are performed in sector units. When a resource of the WC 21 becomes insufficient, data stored on the WC 21 is flushed to the NAND memory 10. When writing is performed in a logical address same as that of data on the RC 22 from the host 1, the latest data is stored on the WC 21. Therefore, when there is data corresponding to the same logical address on the WC 21, the RC 22, and the NAND memory 10, the data is new in the order of the WC 21, the RC 22, and the NAND memory 10, so that the data on the WC 21 is prioritized to be returned to the host 1.

<Main Storage Area (MS) 11>

The MS 11 performs data management in track units, and most user data is stored in the MS 11. A track (high-density track) that has many valid clusters on the WC 21 is directly written from the WC 21 to the MS 11. Moreover, data that cannot be managed by the FS 12 and the IS 13 is input to the MS 11. A track of which LBA is the same as a track input to the MS 11 is invalidated in a logical block, and this logical block is released. A cluster that belongs to the track of which LBA is the same as the track input to the MS 11 is invalidated in FS12, IS13, and a logical block in which all clusters are invalidated is released. The MS 11 consists of a plurality of logical blocks of the MLC mode. In the present embodiment, the size of a track and a logical block is the same, so that additional recording processing performed in the FS 12 or the IS 13 and the compaction (processing for collecting only valid clusters to generate a new logical block and releasing an invalid cluster part) performed in the IS 13 are unnecessary in the MS 11. If the track size is smaller than the logical block size, the additional recording processing performed in the FS 12 and the IS 13 and the compaction performed in the IS 13 can be applied to the MS 11.

<Pre-Stage Storage Area (FS) 12>

The FS 12 is a buffer that adapts a first-in first-out (FIFO) structure in which data is managed in cluster units, and input is performed in units of logical page in which a plurality of clusters is collected. A track (low-density track) with smaller number of valid clusters on the WC 21 is first written in the FS 12. The FS 12 has a FIFO structure in which logical blocks are arranged in the order of data writing. When a cluster of which LBA is the same as a cluster present in the FS 12 is input to the FS 12, it is sufficient to invalidate the cluster in the FS 12, and rewriting is not performed. The cluster of which LBA is the same as the cluster input to the FS 12 is invalidated in a logical block, and a logical block in which all clusters in the logical block are invalidated is released. A cluster stored in a logical block that reaches the end of a FIFO structure of the FS 12 is regarded as a cluster with low possibility of rewriting from the host 1 and the logical block as a whole is relocated to the IS 13 under the management of the IS 13. In the present embodiment, the FS 12 consists of a plurality of logical blocks of the pseudo SLC mode to speed up writing. The FS 12 can consist of a plurality of logical blocks of the MLC mode. Data with a high update frequency is invalidated when passing through the FS 12 and only data with low update frequency overflows from the FS 12, so that the FS 12 can separate data with low update frequency from data with high update frequency. Consequently, it is possible to lower the possibility that the compaction occurs frequently in the IS 13 of a subsequent stage.

<Intermediate Stage Storage Area (IS) 13>

The IS 13 is a buffer for storing a cluster with low possibility of rewriting, and management of data is performed in cluster units in the same manner as the FS 12. When a cluster of which LBA is the same as a cluster present in the IS 13 is input to the FS 12 and the IS 13, it is sufficient to invalidate the cluster in the IS 13, and rewriting is not performed. In the similar manner to the FS 12, the IS 13 has a list structure in which logical blocks are arranged in order from a logical block on which data is written first (from a logical block that is relocated from the FS 12 first); however the IS 13 performs the compaction, which is different from the FS 12. When the capacity of the IS 13 is saturated or management tables for the FS 12 and the IS 13 are saturated, the compaction (collecting valid clusters from the IS 13 and rewriting it to the IS 13) or a defragmentation (integrating clusters of the FS 12 and the IS 13 into a track and flushing it to the MS 11) is performed. In the present embodiment, the IS 13 consists of a mixture of logical blocks of the MLC mode and the pseudo SLC mode. In other words, a block relocated from the FS 12 to the IS 13 is a logical block of the pseudo SLC mode; however, the block is rewritten to a logical block of the MLC mode when performing the compaction in the IS 13. When the FS 12 consists of logical blocks of the MLC mode, the IS 13 also consists of only logical blocks of the MLC mode.

Figure 7:
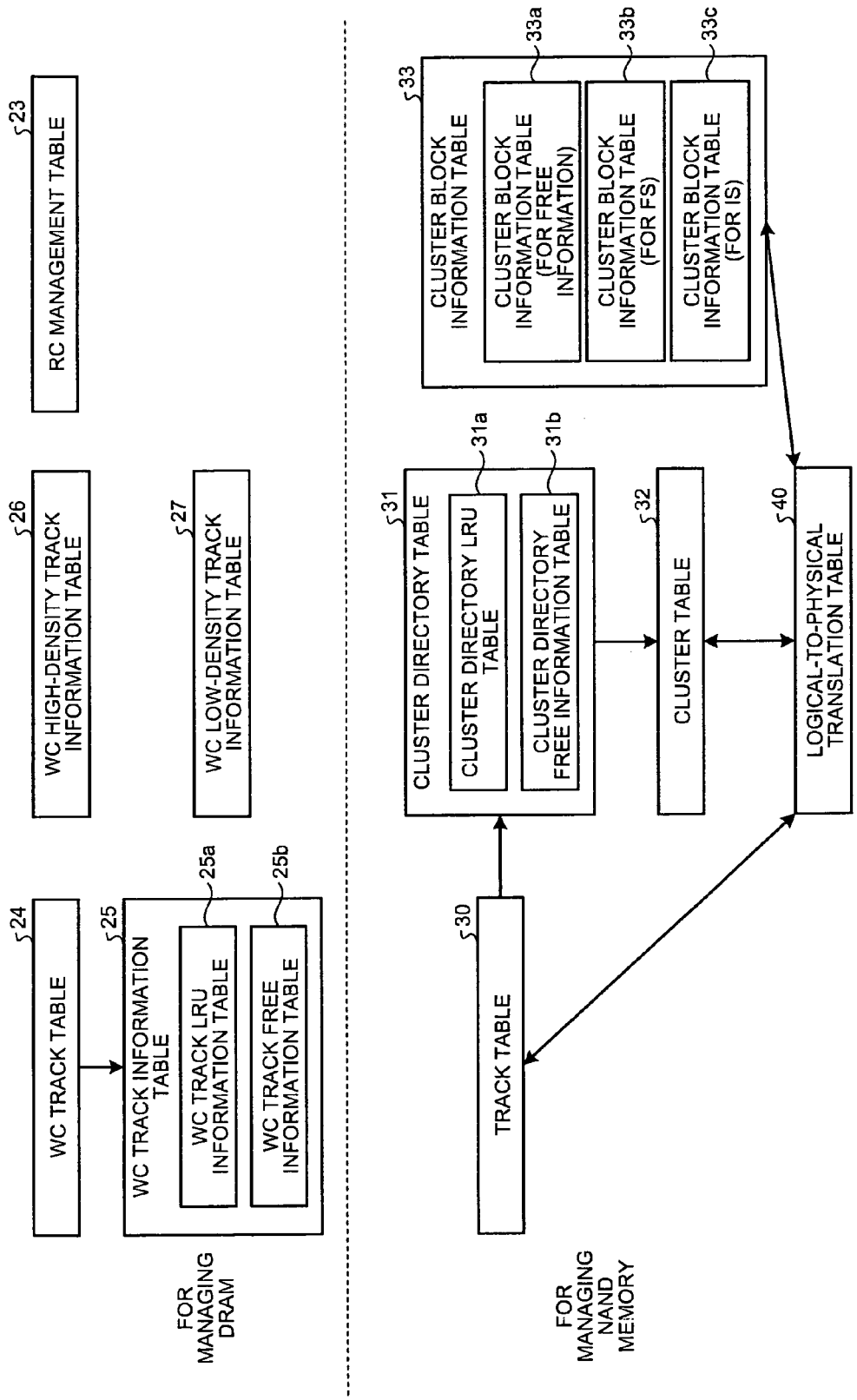
FIG. 7 is a diagram illustrating a configuration example of management tables in a data managing unit.

FIG. 7 is a diagram illustrating management tables for the data managing unit 120 to control and manage the respective components shown in FIG. 5. The table for managing the DRAM 20 includes a RC management table 23, a WC track table 24, a WC track information table 25, a WC high-density track information table 26, and a WC low-density track information table 27. The table for managing the NAND memory 10 includes a track table 30, a cluster directory table 31, a cluster table 32, a cluster block information table 33, and a logical-to-physical translation table 40. The table for managing the NAND memory 10 is classified into a table referred to in a forward lookup address translation and a table referred to in a reverse lookup address translation. The forward lookup address translation is to obtain (logical block address+cluster position) at which data is actually stored from an LBA of the data. The reverse lookup address translation is to obtain an LBA of data from (logical block address+cluster position).

<RC Management Table 23>

The RC management table 23 is for managing data transferred from the NAND memory 10 to the RC 22.

<WC Track Table 24>

The WC track table 24 is a hash table to look up WC track information concerning data stored on the WC 21 from an LBA, and includes a plurality of entries (tags) for each index that is a few bits of least significant bits (LSB) of a track address of an LBA. Each tag stores an LBA track address and a pointer to the WC track information corresponding to the track address.

<WC Track Information Table 25>

The WC track information table 25 includes a WC track least recently used (LRU) information table 25a for managing the time ordering of accessed WC track information by a bi-directional linked list using LRU and a WC track free information table 25b that manages a free WC track information number. When data is flushed from the WC 21 to the NAND memory 10, the oldest accessed track is taken by using the WC track LRU information table 25a.

The WC track information corresponds to one of a plurality of tracks present in the WC 21.

The WC track information includes the followings:
 (1) a track address present in the WC 21, the number of valid clusters on the WC 21 in a track, information indicating whether each cluster is valid, and cluster position information in the WC indicating a position of each cluster in the WC 21,
 (2) information (sector bitmap) indicating a sector that stores valid data among a plurality of sectors included in one cluster, and
 (3) track status information (e.g., valid, invalid, during data transfer from ATA, and during writing in the NAND memory). In the WC track information, LSB (t) bits of a cluster address present in the own track are managed at a storage position at which a valid cluster is present; however, the method of managing a cluster address is arbitrary. For example, the LSB (t) bits themselves of the cluster address present in the own track can be managed (see FIG. 6).

<WC High-Density Track Information Table 26>

The WC high-density track information table 26 is for managing high-density (the number of valid clusters in a track is equal to or more than a specific percentage) track information to be written in the MS 11 and manages the WC track information concerning a high-density track and the number thereof.

<WC Low-Density Track Information Table 27>

The WC low-density track information table 27 is for managing low-density (the number of valid clusters in a track is less than a specific percentage) track information to be written in the FS 12 and manages the total number of clusters of a low-density track.

<Track Table 30 (Forward Lookup)>

The track table 30 is a table for obtaining track information from a track address of an LBA. The track information includes the followings:
 (1) a logical block address (information indicating a logical block in which data of a track is stored),
 (2) a cluster directory number (information that becomes valid when at least part of data in a track is stored in the FS 12 or the IS 13 and that indicates a table number of a cluster directory table that is present for each track when data in a track is stored in the FS 12 or the IS 13), and
 (3) the number of FS/IS clusters (information that indicates the number of clusters in a track stored in the FS 12 or the IS 13 and is used for determining whether to perform the defragmentation).

<Cluster Directory Table 31 (Forward Lookup)>

The cluster directory table 31 is an intermediate table for tracing to the logical block when data in a track is stored in the FS 12 or the IS 13. The cluster directory table 31 is provided for each track. Cluster directory information registered in each cluster directory table 31 consists of an array of information (cluster table number information) indicating a table number of the cluster table 32. One piece of information is selected from among a plurality of pieces of the cluster table number information arrayed in one cluster directory table 31 by upper few bits in LSB (t) bits of a cluster address of an LBA.

The cluster directory table 31 includes a cluster directory LRU table 31a for managing the time ordering of the cluster directory information (array of the cluster table number information) together with a corresponding track address with a writing time as a reference by a bi-directional linked list using the LRU and a cluster directory free information table 31b that manages a free cluster directory together with a corresponding track address by a bi-directional linked list.

<Cluster Table 32 (Forward Lookup)>

The cluster table 32 is a table that relates to the cluster directory table 31 and manages a cluster position in a logical block at which data is stored when the data in a track is stored in the FS 12 or the IS 13. The cluster table 32 is referred to from the track table 30 indirectly via the cluster directory table 31. The cluster table 32 is actually an array of (logical block address+cluster position) for a plurality of clusters. One piece of information is selected from among a plurality of pieces of (logical block address+cluster position) arrayed in one cluster table 32 by lower few bits in LSB (t) bits of a cluster address of an LBA. The cluster table 32 also includes a cluster block information number and information about a cluster position therein as an array.

<Cluster Block Information Table 33 (Reverse Lookup)>

A cluster block is a block that stores data in cluster units among logical blocks. Cluster block information is information for managing logical blocks of the FS 12 and the IS 13 and indicates a type of a cluster present in the logical blocks. A plurality of the cluster block information is coupled in the order of FIFO in the FS 12 and the IS 13 as a bi-directional linked list.

The cluster block information includes the followings:
(1) a logical block address,
(2) the number of valid clusters, and
(3) an LBA of a cluster included in a logical block.

The cluster block information table 33 includes a cluster block information table 33a for managing free information, a cluster block information table 33b for the FS 12, and a cluster block information table 33c for the IS 13. The cluster block information table 33a manages unused cluster block information, the cluster block information table 33b manages the cluster block information included in the FS 12, and the cluster block information table 33c manages the cluster block information included in the IS 13. Each of the cluster block information tables 33a to 33c is managed as a bi-directional linked list. The principal use of the reverse lookup address translation is the compaction of the IS 13. The reverse lookup address translation is used to check a type of a cluster stored in a logical block as a compaction target and rewrite data to a different location. Therefore, in the present embodiment, the reverse lookup address translation targets only the FS 12 and the IS 13 that store data in cluster units.

<Logical-to-Physical Translation Table 40 (Forward Lookup)>

The logical-to-physical translation table 40 is a table for managing information concerning translation between a logical block address and a physical block address and the life. The logical-to-physical translation table 40 includes information indicating a plurality of physical block addresses belonging to a logical block, information indicating the number of times of erasing of a logical block address, and information about a cluster block information number, for each logical block address. For rewriting data of a certain LBA to a different location, an LBA in an original cluster block needs to be invalidated, so that it is needed to trace to a cluster block from the LBA. Therefore, an identifier of the cluster block information is stored in management information of a logical block managed by the logical-to-physical translation table 40.

(Snapshot and Log)

With the management information managed by each management table, an LBA used in the host 1, a logical NAND address (logical block address+offset) used in the SSD 100, and a physical NAND address (physical block address+offset) used in the NAND memory 10 can be associated with each other, so that data exchange between the host 1 and the NAND memory 10 can be performed.

The tables for NAND memory management, such as the track table 30, the cluster directory table 31, the cluster table 32, the cluster block information table 33, and the logical-to-physical translation table 40 shown in FIG. 7, among the above management tables are stored in a specific area of the nonvolatile NAND memory 10. At the time of start-up, each management table stored in the NAND memory 10 is loaded onto a work area of the volatile DRAM 20, which is used by the data managing unit 120, so that each management table is updated. Each management table loaded on the DRAM 20 is called a master table. Even when the power is turned off, a master table needs to be restored to a state before the power is turned off, so that a system of storing the master table in the nonvolatile NAND memory 10 is needed. A snapshot indicates a whole nonvolatile management table on the NAND memory 10. An operation of storing a master table loaded on the DRAM 20 directly in the NAND memory 10 is expressed also as "take a snapshot". A log indicates a change difference of a management table. If a snapshot is taken for every update of a master table, a processing speed becomes slow and the number of times of writing in the NAND memory 10 increases, so that only a log as a change difference is normally recorded in the NAND memory 10. An operation of reflecting a log in a master table and storing it in the NAND memory 10 is expressed also as "commit".

Figure 8:
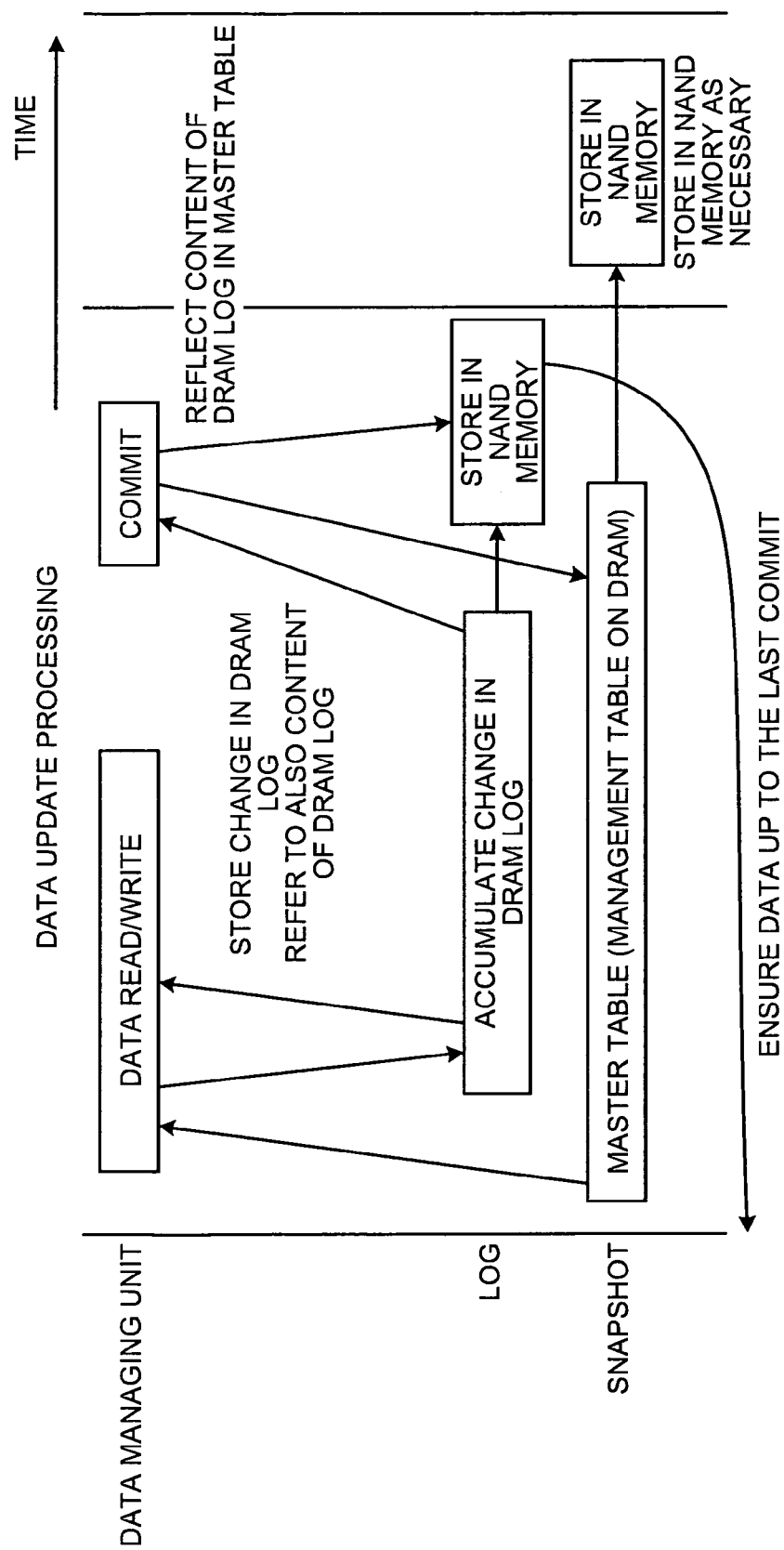
FIG. 8 is a diagram conceptually illustrating a generation state of a snapshot and a log.

FIG. 8 is a diagram illustrating an updating state of a snapshot and a log at the time of data update. When the data managing unit 120 updates data, changes made to a master table are accumulated in a log (hereinafter, "DRAM log") on the DRAM 20. Depending on the type of a management table, a master table is directly updated and an updated content is accumulated in a DRAM log, or an updated content is recorded in a change area secured on the DRAM log without directly changing a master table. When performing data readout or data writing, the accumulated DRAM log is also referred to in addition to a master table.

After data update becomes stable, a log is committed. In the commit processing, a content of a DRAM log is reflected in a master table as necessary and is further stored in the NAND memory 10 to make it nonvolatile. A snapshot is stored in the NAND memory 10 on occasions such as in a normal power-off sequence and when a storage area for a log becomes insufficient. At the time when writing of a log or a snapshot in the NAND memory 10 is finished, the processing of making a management table nonvolatile is completed. A technology for making the management information nonvolatile in this manner is disclosed, for example, in International Patent Application PCT/JP2009/052597, and the whole content thereof is incorporated in the present application.

<Read Processing>

Read processing is briefly explained. When a read command and an LBA as a readout address are input from the ATA-command processing unit 121, the data managing unit 120 searches through the RC management table 23 and the WC track table 24 to check whether data corresponding to the LBA is present in the WC 21 or the RC 22. In the case of a cache hit, the data managing unit 120 reads out data of the WC 21 or the RC 22 corresponding to the LBA and sends the data to the ATA-command processing unit 121.

If there is no hit in the RC 22 or the WC 21, the data managing unit 120 searches in which part of the NAND memory 10 data as a search target is stored. If the data is stored on the MS 11, the data managing unit 120 traces the LBA→the track table 30→the logical-to-physical translation table 40 to obtain the data on the MS 11. On the other hands, if the data is stored on the FS 12 or the IS 13, the data managing unit 120 traces the LBA→the track table 30→the cluster directory table 31→the cluster table 32→the logical-to-physical translation table 40 to obtain the data on the FS 12 or the IS 13.

<Write Processing>

(Processing in the WC 21)

Figure 9:
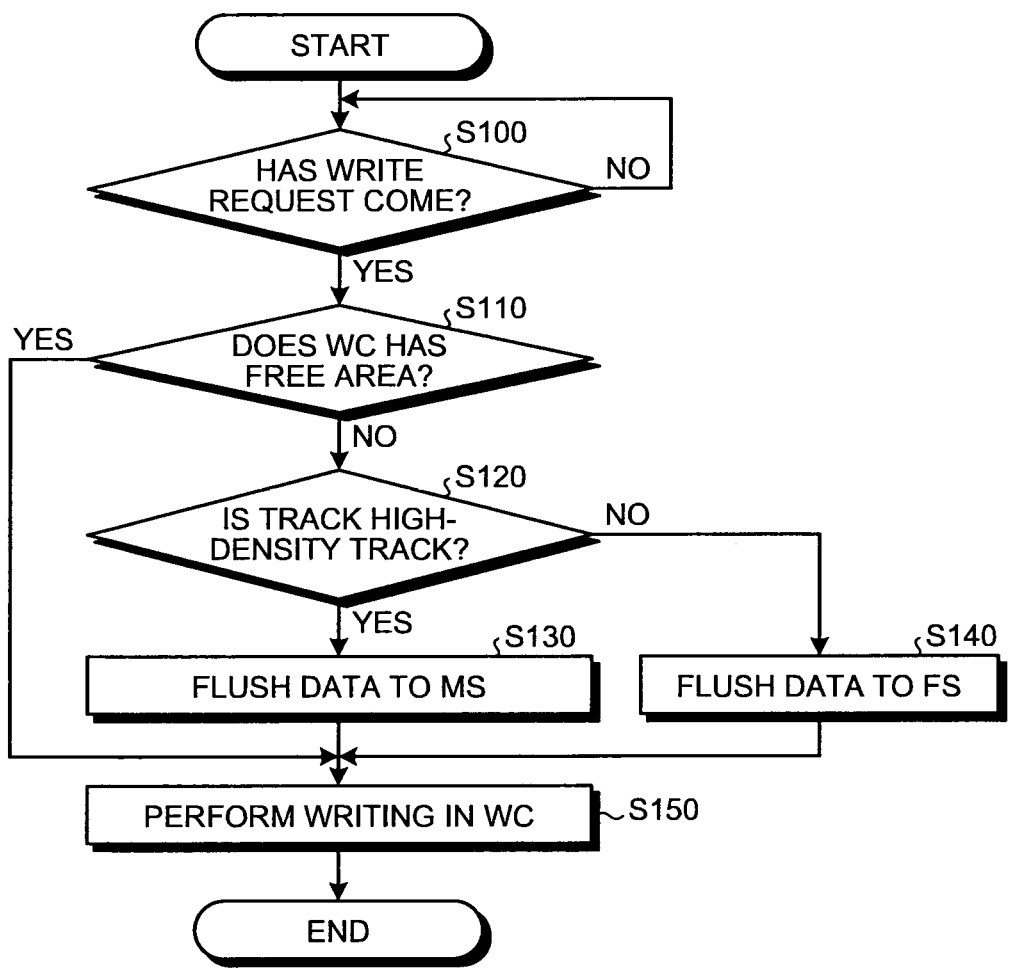
FIG. 9 is a flowchart illustrating write processing in a write cache (WC).

Next, the write processing is briefly explained in accordance with a flowchart shown in FIG. 9. In the write processing, when a write command and an LBA as a write address are input from the ATA-command processing unit 121 (Step S100), the data managing unit 120 writes data specified by the LBA in the WC 21. Specifically, the data managing unit 120 judges whether there is a free area corresponding to the write request in the WC 21 (Step S110), and writes the data specified by the LBA in the WC 21 when there is a free area in the WC 21 (Step S150).

On the other hand, when the WC 21 has no free area corresponding to the write request, the data managing unit 120 flushes data from the WC 21 by referring to various management tables for DRAM management to write it in the NAND memory 10, thereby generating a free area. Specifically, the data managing unit 120 checks the number of valid clusters in tracks (Step S120), determines a track in which the number of valid clusters in the track is less than a specific percentage as a low-density track, and flushes it as cluster size data to the FS 12 as a flush destination (Step S140). When the flush destination is the FS 12, a valid cluster in the track is written in logical page units.

In the judgment at Step S120, when it is judged that the number of valid clusters in a track is equal to or more than the specific percentage, this track is determined as a high-density track and is flushed as track size data to the MS 11 as a flush destination (Step S130). When the flush destination is the MS 11, the data of the track size is directly written in the whole logical block. When there is a plurality of logical blocks as a writing target, the transfer efficiency is improved by using the double speed mode or the bank interleave.

In this manner, after generating a free area in the WC 21, the data specified by the LBA is written in the WC 21 (Step S150). Various management tables for DRAM management are updated in accordance with the data written in the WC 21 or the data flushing to the NAND memory 10.

(Writing from the WC 21 to the MS 11)

Figure 10:
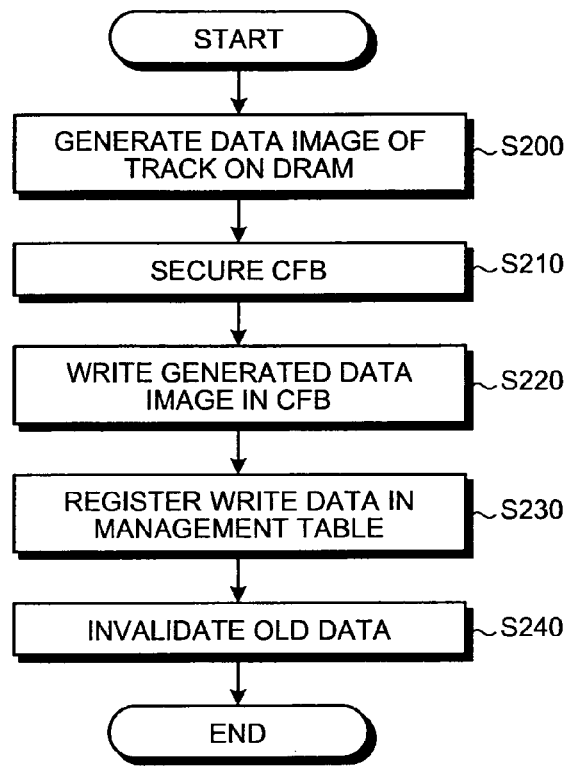
FIG. 10 is a flowchart illustrating an operation procedure of the write processing from the WC to a main storage area (MS).
Figure 11:
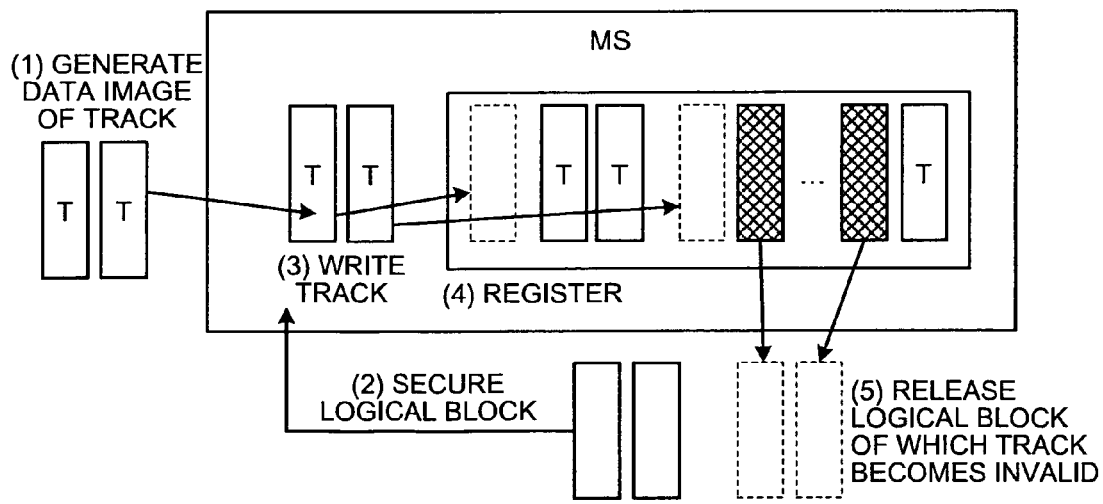
FIG. 11 is a schematic diagram illustrating an operation concept of the write processing from the WC to the MS.

Next, the write processing of a high-density track from the WC 21 to the MS 11 is explained in accordance with FIG. 10 and FIG. 11. FIG. 10 is a flowchart illustrating an operation procedure thereof, and FIG. 11 is a schematic diagram illustrating an operation concept thereof.

Writing to the MS 11 is performed in the following procedures. The data managing unit 120 can select a plurality of high-density tracks to which writing can be performed in parallel by utilizing the bank interleave in addition to the high-density track that is a flush target.

1. The data managing unit 120 generates a data image of a track on the DRAM 20 (padding processing) (Step S200). Specifically, a cluster that is not present in the WC 21 and a cluster that holds not all of the sectors in the WC 21 are read out from the NAND memory 10 to be integrated with data in the WC 21.

2. The data managing unit 120 secures a logical block (track block) from a CFB for the MS 11 (Step S210). The track block is a block that stores therein data in track units among logical blocks.

3. The data managing unit 120 writes the data image of the track generated at Step S200 in the logical block secured at Step 210 (Step S220).

4. The data managing unit 120 checks the track information from an LBA of the track, associates the track information with a logical block address corresponding to the written logical block, and registers it in a required table for NAND memory management (Step S230).

5. The data managing unit 120 invalidates old data in the WC 21 and the NAND memory 10 (Step S240). Specifically, the data managing unit 120 causes cache data in the WC 21 flushed to the MS 11 and data in the NAND memory 10 used in the padding processing at Step S200 to be an invalid state from a valid state on a management table to invalidate them.

(Writing from the WC 21 to the FS 12)

Figure 12:
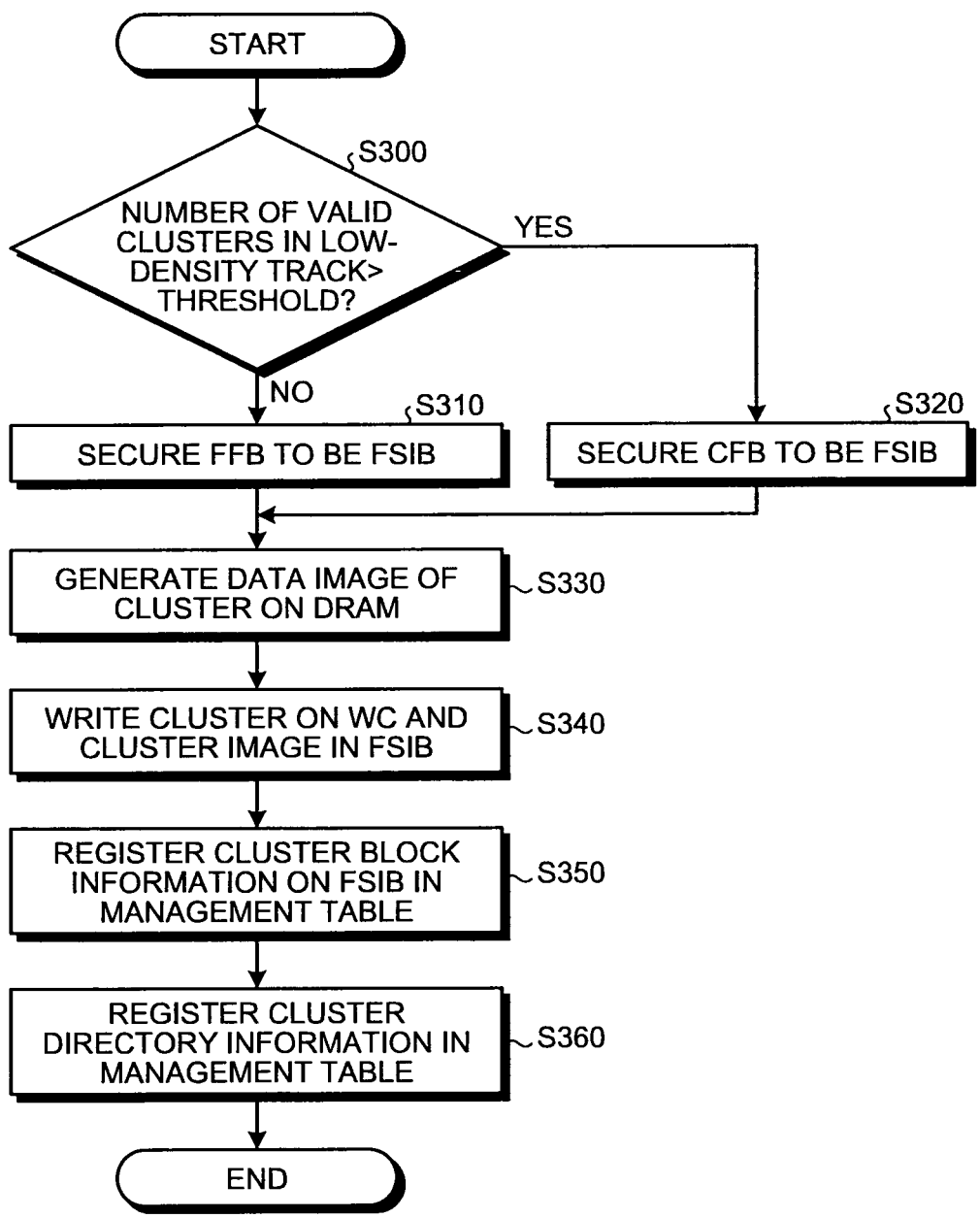
FIG. 12 is a flowchart illustrating an operation procedure of the write processing of a low density track from the WC to a pre-stage storage area (FS).
Figure 13:
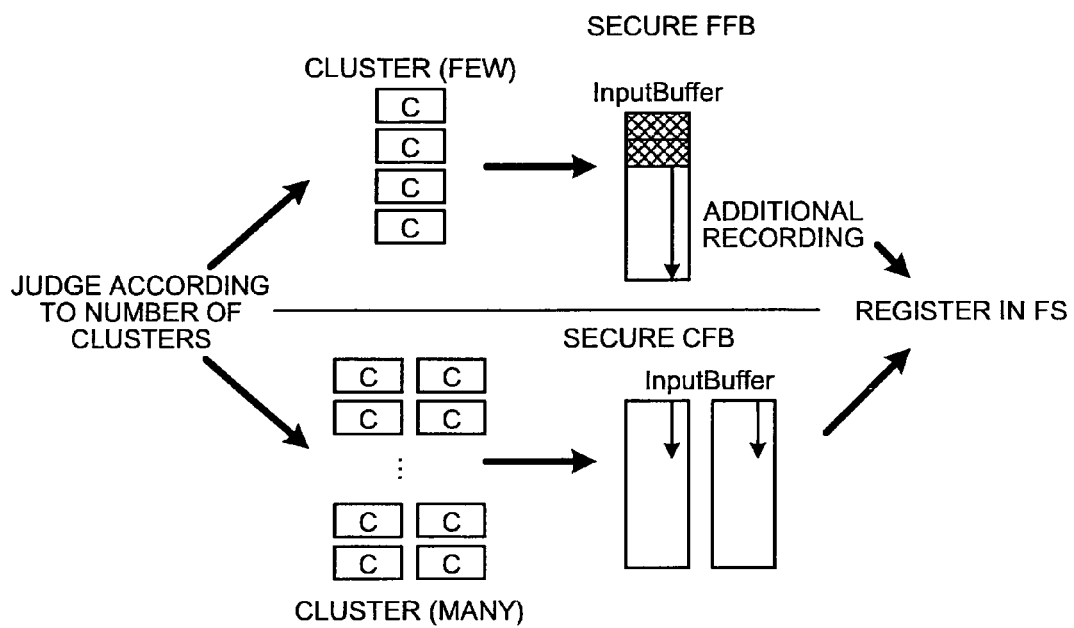
FIG. 13 is a schematic diagram illustrating an operation concept of the write processing of a low density track from the WC to the FS.

Next, the write processing of a low-density track from the WC 21 to the FS 12 is explained in accordance with FIG. 12 and FIG. 13. FIG. 12 is a flowchart illustrating an operation procedure thereof, and FIG. 13 is a schematic diagram illustrating an operation concept thereof.

Writing to the FS 12 is performed by generating a data image of a cluster on the DRAM 20 (padding processing) and performing writing in logical page units in a newly-secured logical block (cluster block) by using the pseudo SLC mode. As the logical block to be secured, an FFB having a logical page capable of writing equal to or more than a data image to be written is prioritized. If an FFB is not present, a CFB is used. The writing in the FS 12 is performed in the following procedures.

A logical block (cluster block) for writing data of a low-density track from the WC 21 to the FS 12 is called an FS input buffer (FSIB). The data managing unit 120 can involve other low-density tracks so that a cluster data amount to be written coincides with a logical block boundary of the pseudo SLC mode in addition to the low-density track that is a flush target.

1. The data managing unit 120 judges a total data amount in the low-density track input from the WC 21 (Step S300). When the judged total data amount, is small, i.e., when the number of valid clusters is smaller than a specific threshold, the data managing unit 120 secures an FFB in which the data can be written to be an FSIB (Step S310).

2. When the data managing unit 120 judges that the total data amount in the low-density track input from the WC 21 is large, i.e., when the number of valid clusters is equal to or larger than the specific threshold, the data managing unit 120 secures a CFB to be an FSIB (Step S320). At this time, a plurality of logical blocks capable of writing data in parallel is secured to be an FSIB.

3. The data managing unit 120 generates a data image of a cluster to be written on the DRAM 20 (Step S330). Specifically, for a cluster that holds not all of sectors in the WC 21, the data managing unit 120 reads out data of a sector that is not present on the WC 21 from the NAND memory 10 to be integrated with the data of the sectors on the WC 21.

4. The data managing unit 120 writes the cluster on the WC 21 and the cluster image generated on the work area in the FSIB (Step S340).

5. The data managing unit 120 adds the cluster block information on this FSIB to the cluster block information table 33$b$ for the FS (Step S350).

6. The data managing unit 120 reinserts the cluster directory information on the low-density track written in the FSIB into the end of the cluster directory LRU table 31$a$ together with a corresponding track address (Step S360).

(Relocation from the FS 12 to the IS 13)

Figure 14:
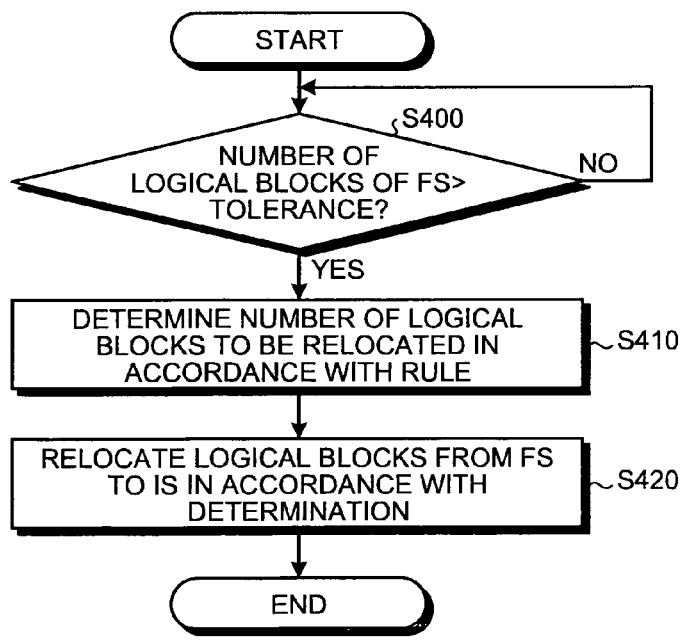
FIG. 14 is a flowchart illustrating an operation procedure of data relocation from the FS to an intermediate stage storage area (IS).
Figure 15:
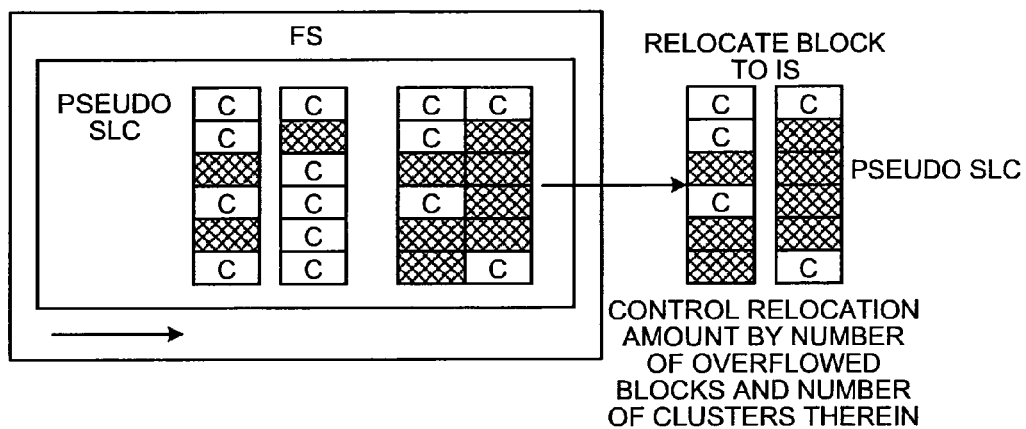
FIG. 15 is a schematic diagram illustrating an operation concept of the data relocation from the FS to the IS.

Next, data relocation from the FS 12 to the IS 13 is explained in accordance with FIG. 14 and FIG. 15. FIG. 14 is a flowchart illustrating an operation procedure thereof, and FIG. 15 is a schematic diagram illustrating an operation concept thereof.

The data managing unit 120 judges whether the number of logical blocks under the management of the FS 12 exceeds a specific maximum number of logical blocks (Step S400). When the number of logical blocks under the management of the FS 12 exceeds the specific maximum number of logical blocks, as shown in FIG. 15, the data managing unit 120 relocates a logical block that is overflowed from the FS 12 directly to the IS 13. In the present embodiment, the FS 12 consists of a plurality of logical blocks of the pseudo SLC mode, and a logical block of the pseudo SLC mode is directly relocated from the FS 12 to the IS 13. The number of logical blocks to be relocated in one process unit is determined by the following rule in accordance with the number of valid clusters in the overflowed logical block and the like (Step S410).

A logical block that is relocated is added from the oldest logical block of the FS 12 so that the total number of clusters in the overflowed logical block becomes close to the boundary of one logical block of the MLC mode, i.e., close to the number ($2^r$) of clusters for one logical block or a multiple ($m \times 2^r$: m is a natural number) thereof. For example, when the number of clusters in the overflowed logical block is a value between $2^r$ and $2^{r+1}$, the number of logical blocks as a relocation target is increased so that the number of clusters is close to $2^{r+1}$ (including $2^{r+1}$). The number of clusters is caused to be close to the boundary of one logical block of the MLC mode to accommodate valid clusters as many as possible in a logical block after the compaction.

When the number of clusters exceeds the number of clusters z that can be subjected to the compaction simultaneously in the IS 13, the number of logical blocks is set so that the number of clusters is equal to or smaller than this number of clusters z.

The upper limit is set to the number of logical blocks to be relocated in one processing. This limitation is set for preventing temporary increase of the number of logical blocks under the management of the IS 13.

The logical blocks as a relocation target determined in this manner are relocated from the FS 12 to the IS 13 (Step S420).

(Compaction and Defragmentation in the IS 13)

Figure 16:
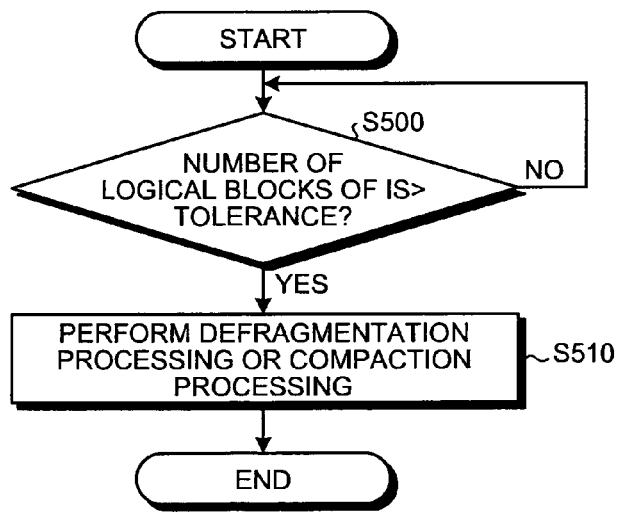
FIG. 16 is a flowchart illustrating an operation procedure of defragmentation processing and compaction processing in the IS.

Next, the compaction processing and the defragmentation processing in the IS 13 are explained in accordance with a flowchart shown in FIG. 16.

The data managing unit 120 judges whether the number of logical blocks under the management of the IS 13 exceeds a specific maximum number of logical blocks (Step S500). When the number of logical blocks under the management of the IS 13 exceeds the maximum number of logical blocks, the data managing unit 120 performs data relocation (defragmentation processing) to the MS 11 and the compaction processing to suppress the number of logical blocks under the management of the IS 13 to be equal to or less than the maximum number of logical blocks (Step S510). When a data erasing unit (logical block) and a data management unit (cluster) are different, according to the progress of rewriting of the NAND memory 10, logical blocks are made porous by invalid data. When the logical blocks in such a porous state increase, substantially usable logical blocks decrease and a storage area of the NAND memory 10 cannot be effectively used. Therefore, processing called compaction for collecting valid clusters and rewriting it in a different logical block is performed. The defragmentation processing is processing of integrating clusters of the FS 12 and the IS 13 into a track and flushing it to the MS 11.

Figure 17:
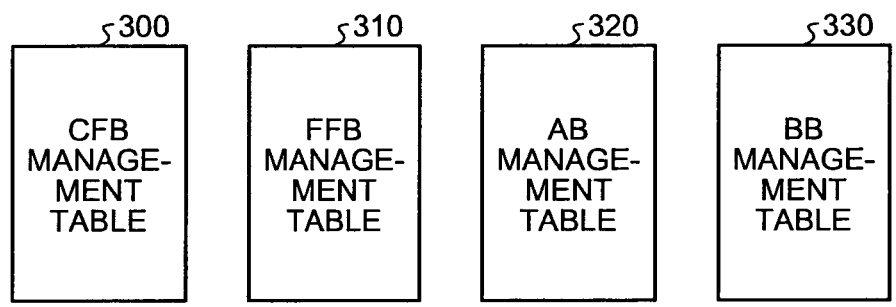
FIG. 17 is a diagram illustrating other management tables.

Subsequently, the essential part of this embodiment is explained more in detail. The tables for NAND memory management include, as shown in FIG. 17, a complete-free-block management table (CFB management table) 300, a fragment-free-block management table (FFB management table) 310, an active-block management table (AB management table) 320, and a bad-block management table (BB management table) 330 other than the management tables shown in FIG. 7.

The CFB management table 300 is for managing a CFB. The CFB is an FB that erases a logical block immediately before use and is written in the erased state, and data can be written therein from the logical page positioned at the top of the logical block. In the present embodiment, the CFB is used in the MS 11, the FS 12, and the IS 13. The CFB management table 300 includes two types of structure, that is, a return list and an acquisition list. A return FIFO list is for holding the logical blocks that are not used for a certain period of time and releasing the logical blocks, and is sorted by the times of erasing. An allocation list is provided upon reception of an acquisition request of a CFB, and is sorted in order of the number of times of erasing (a logical block having less number of times of erasing is positioned at the top of the list). A block pushed out from a return list 220a is inserted into the middle of the allocation list according to the number of times of erasing. When allocation of a CFB is requested, the data managing unit 120 takes out a CFB from the top of the allocation list and allocates the CFB.

The FFB management table 310 is for managing an FFB. The FFB is a logical block in which although invalid data is written up to the middle of the logical page, the remaining logical page is in the erased state, and data can be additionally written to the remaining logical page. The FFB is used in the FS 12 and the IS 13. In the FFB management table 310, the logical block address used as the FFB is managed as the bi-directional list for each number of free logical pages. The FFB management table 310 manages information for distinguishing a logical page (invalid page) in which data is written from a logical page (unused page) in which data has not been written.

The AB management table 320 is a list of logical blocks (active blocks AB) in which use is allocated from an FB to the MS 11, the FS 12, and the IS 13, and respective entries hold the logical block address. The logical block registered first is positioned at the top. The AB management table is used, for example, for refresh processing.

The BB management table 330 is for managing bad blocks BB in units of individual physical block constituting the logical block. For example, a physical block for which the data erasing is not normally finished is registered as the bad block BB in the BB management table 330.

Figure 18:
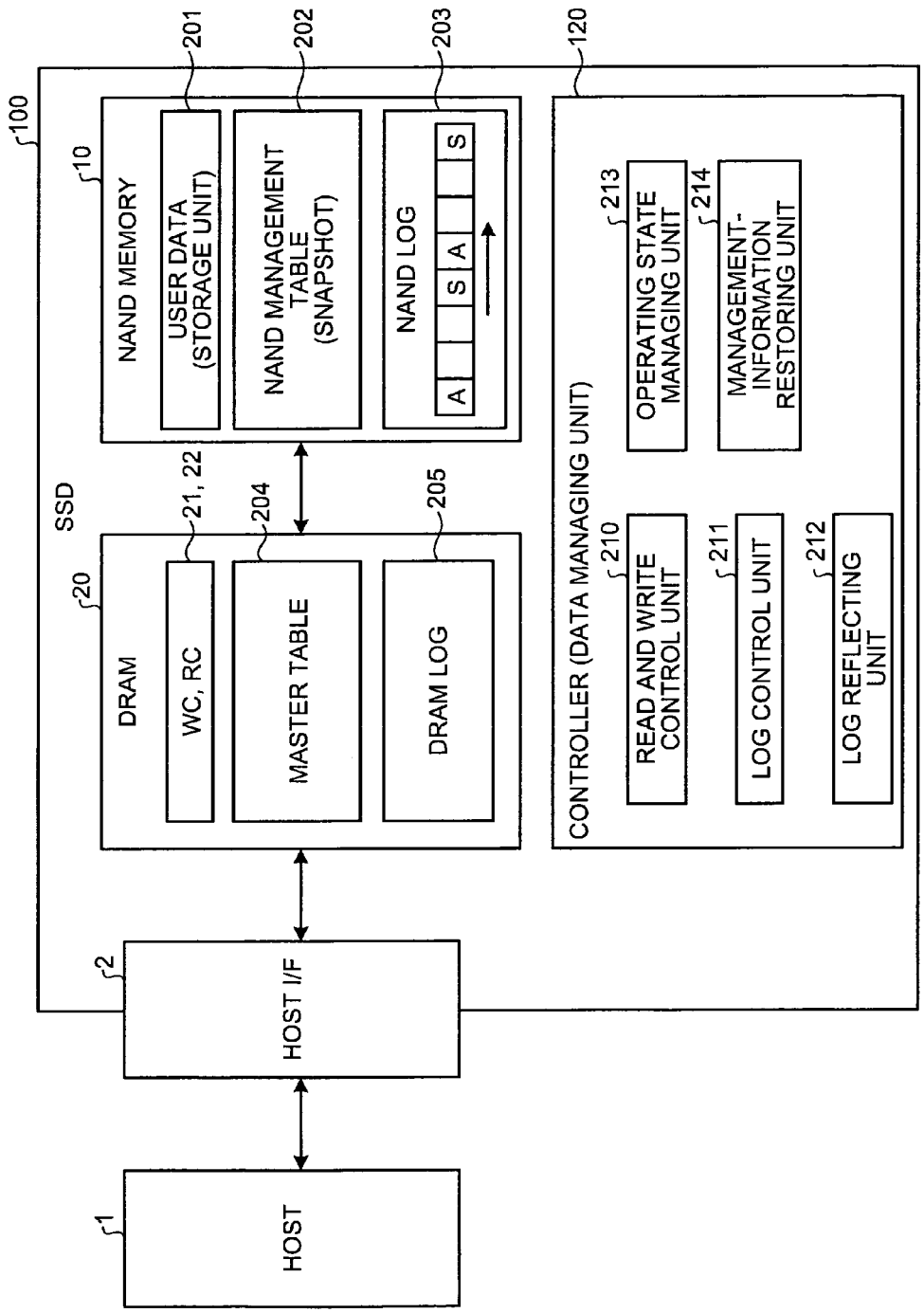
FIG. 18 is a functional block diagram illustrating a configuration of an essential part in a present of the present invention.

FIG. 18 is a block diagram of a functional configuration of the essential part in the present embodiment. The NAND memory 10 stores therein a user data (storage unit) 201 such as the MS 11, the FS 12, and the IS 13 that store user data, various management tables for NAND memory management (the track table 30, the cluster directory table 31, the cluster table 32, the cluster block information table 33, the logical-physical translation table 40, the CFB management table 300, the FFB management table 310, the AB management table 320, and the BB management table 330 in FIG. 7) 202 excluding the tables for DRAM management in the management tables shown in FIGS. 7 and 17, stored in a specific storage area on the NAND memory 10 as the snapshot, and a NAND log 203 including a difference log as the difference information before and after update of a NAND management table 202, an Active log, and a Standby log, stored in a specific storage area (nonvolatile log area) on the NAND memory 10 as in the NAND management table 202.

The DRAM 20 includes an area functioning as the WC 21 and the RC 22. Moreover, the DRAM 20 includes an area in which a master table 204 that is the NAND management table 202 loaded on the DRAM 20 is stored. Furthermore, the DRAM 20 includes an area in which a DRAM log 205 that includes the difference log, which is the difference information before and after update when the master table 204 is updated, and the Active log and the Standby log is stored.

The controller 120 as the data managing unit includes a read and write control unit 210, a log control unit 211, a log reflecting unit 212, an operating state managing unit 213, and a management-information restoring unit 214. Each function block in each embodiment in the present invention can be realized by any one of or a combination of hardware and software. Therefore, each function block is generally explained below from the viewpoint of a function thereof to make it clear that each function block is any of hardware and software. It depends on a specific embodiment or design constraints imposed on the whole system whether such functions are realized as hardware or software. A person skilled in the art can realize these functions by various methods for each specific embodiment, and determining such realization is included within the scope of the present invention.

The read and write control unit 210 controls readout and writing based on the master table 204 and the DRAM log 205. For example, the read and write control unit 210 performs data writing to the DRAM 20 (WC 21) and data readout from the DRAM 20 (RC 22) in accordance with a command and a logical address input from the host 1 via the host I/F 2. Moreover, for example, the read and write control unit 210 performs data writing from the DRAM 20 (WC 21) to the NAND memory 10 and data readout from the NAND memory 10 to the DRAM 20 (RC 22) based on the logical-to physical translation table 40 and the like.

The log control unit 211, for example, executes:

processing for transferring the various NAND management tables (snapshots) 202 stored in the NAND memory 10 as the master table 204 to the DRAM 20 at the time of system startup;

processing for accumulating and storing the difference log, which is the difference information before and after update of the master table 204 in the DRAM log 205 when an event to update the master table 204 occurs such as when the read and write control unit 210 performs data writing to the NAND memory 10; and snapshot processing for storing the master table on the DRAM 20 in the NAND memory 10 as the snapshot, when a specific condition is established, such as when the normal power-off sequence occurs or the storage area (area for storing the DRAM log 205) of the log on the DRAM 20 becomes insufficient.

When a specific condition is established, such as when an amount (amount of the DRAM log 205) of the log in the DRAM 20 reaches a certain amount or reaches a point at which matching is achieved between the updated management tables (master table 204), the log reflecting unit 212 additionally stores the DRAM log 205 in the NAND log (nonvolatile log) 203 including the logical blocks in the NAND memory 10, and executes the commit processing for reflecting the DRAM log 205 in the master table 204. When the snapshot processing or the commit processing is performed, the DRAM logs 205 that have been accumulated on the DRAM 20 are invalidated. The logical block used for storing the log can be a logical block in the pseudo SLC mode to achieve high speed.

The operating state managing unit 213 performs log recording processing for detecting an incorrect power-off, in which the Active log indicating that the system is running is recorded in the NAND log 203 before the log reflecting unit 212 records the first difference log in the NAND log 203 after the system startup and the Standby log indicating that the system halts is recorded following the difference log or the Active log in the NAND log 203 when normal system halt is performed.

The management-information restoring unit 214 executes:

processing for detecting at least one of the Active log, the difference log, and the Standby log in the NAND log 203 and judging whether the normal system halt is performed or an incorrect power-off sequence is performed last time, based on a recorded state of the Active log and the Standby log at the time of system startup; and processing for changing the management table so that all FFBs are released and the released all FFBs are used as a CFB thereafter, when it is judged that the incorrect power-off sequence is performed.

FIG. 19 is a flowchart illustrating a procedure of storing the Active log, the Standby log, and the difference log. The operating state managing unit 213 manages whether the SSD 100 as a system is in an Active state in which the SSD is running or a Standby state in which the SSD halts as power-mode information.

It is assumed that immediately after the power is turned on (power is supplied to the power supply circuit 5, internal power supply and a power-on reset signal are generated, and the drive control circuit 4 is initialized, whereby the system starts), the operating state managing unit 213 recognizes the operation state of the SSD 100 as the Standby state (Step S1100).

Upon reception of a command having a possibility that the data managing unit 120 accesses the NAND memory 10 from the host 1 (for example, at the time of completion of initialization, at the time of requesting activation, and at the time of requesting data access), after the power is turned on (Standby state), the operating state managing unit 213 stores the Active log in the NAND log 203, and thereafter, turns the operating state of the SSD 100 to the Active state (Step S1101).

When an even occurs so that the master table 204 needs to be updated, such as when data writing to the NAND memory 10 is performed, the log control unit 211 accumulates the difference log, which is the difference information before and after update of the master table 204, in the DRAM log 205 (Step S1102).

When a specific condition is established, the log reflecting unit 212 additionally stores the DRAM log 205 (difference log) in the NAND log 203 including logical blocks of the NAND memory 10 and performs the commit processing for reflecting the DRAM log 205 in the master table 204 (Step S1103).

At the time of a halt request (Standby request) from the host 1, the operating state managing unit 213 performs flush processing for writing data on the WC 21 in the NAND memory 10 to make the data nonvolatile. Along with the flush processing, the log control unit 211 accumulates the difference log that is the difference information before and after update of the master table 204 in the DRAM log 205 (Step S1104).

The log reflecting unit 212 additionally stores the DRAM log 205 (difference log) in the NAND log 203 including logical blocks of the NAND memory 10 and performs the commit processing for reflecting the DRAM log 205 in the master table 204. Moreover, when a specific condition is established, the log control unit 211 performs the snapshot processing (Step S1105).

The operating state managing unit 213 turns the operating state of the SSD 100 to the Standby state, and stores the Standby log in the NAND log 203 following the difference log. The SSD 100 can perform the normal power-off sequence after the Standby log is normally written (Step S1106).

Figure 20A:
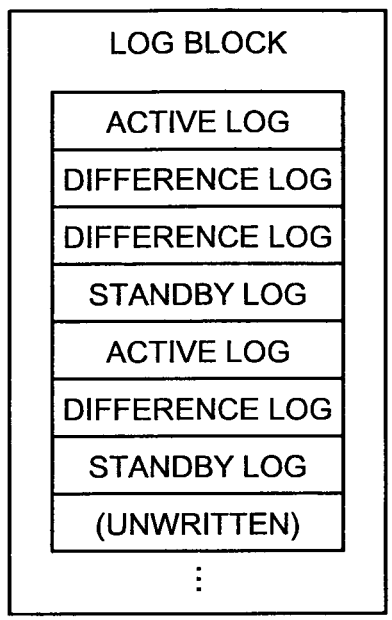
FIGS. 20A and 20B are diagrams illustrating the Active log and the Standby log when a normal power-off sequence is performed and when an abnormal power-off has occurred, respectively.
Figure 20B:
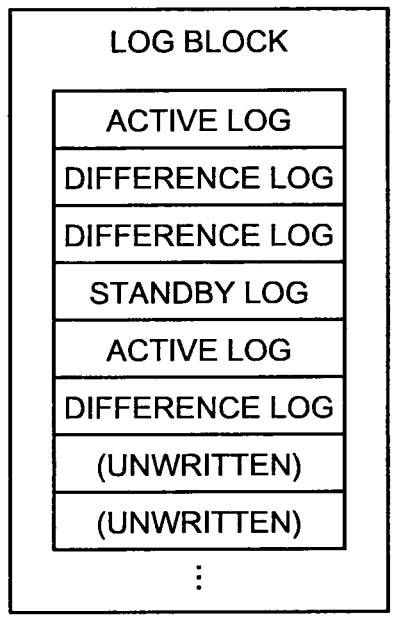

FIG. 20A illustrates a state of the NAND log 203 at the time of the next system startup when the normal power-off sequence is performed, and FIG. 20B illustrates a state of the NAND log 203 at the time of the next system startup when an incorrect power-off has occurred.

As shown in FIG. 20A, in the case of the normal power-off, the Active log is recorded first, the difference log is recorded next (the difference log may not be present), and the Standby log is recorded last. In this manner, in the case of the normal sequence, the data is not updated in the Standby state. Because the normal power-off sequence is performed after receiving a halt request from the host 1, the power off in the Active state is not performed.

The management-information restoring unit 214 reads the NAND log 203 from the NAND memory 10 in the initialization processing after the power is turned on, and scans the content thereof from the front. Normally, the content starts from the Active log, and the difference log and then the Standby log, and thereafter, this sequence is repeated, and lastly the content ends by the Standby log. When the Active log is recorded first and the Standby log is recorded last, the management-information restoring unit 214 judges that the normal power-off sequence is performed.

On the other hand, as shown in FIG. 20B, in the case of the incorrect power-off, only the Active log is present and the Standby log is not recorded last. That is, the incorrect power-off can be detected in which "writing is performed into the NAND memory 10, however, the commit of the log has not finished" by storing the Active log. When recognizing that the last log is not the Standby log (Active log or difference log), the management-information restoring unit 214 judges that there was an incorrect power-off.

In a case that there is no Active log and there is only the Standby log, when an incorrect power-off occurs before recording the first difference log in the NAND log 203 after power ON, the Standby log due to the previous normal power-off is recorded last, and hence, the incorrect power-off cannot be distinguished from the normal power-off. Therefore, it is possible to detect the incorrect power-off with a simple configuration by using both of the Active log and the Standby log as in the present embodiment.

Figure 21:
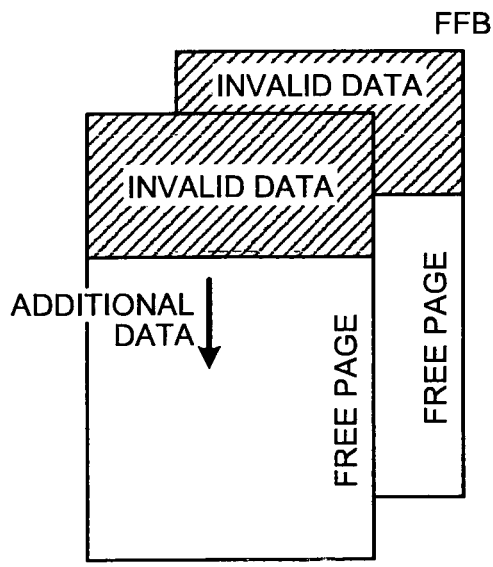
FIG. 21 is a conceptual diagram illustrating a fragment free block (FFB).

Processing performed when the management-information restoring unit 214 judges that an incorrect power-off has occurred is explained next. In an MLC NAND memory, when an upper page is added to a physical block in which the data has already been recorded, the content of a lower page recorded in the past may be lost, and the data in the physical block may not be able to be read after writing is performed with respect to one physical page, in the NAND memory not limited to the SLC/MLC NAND memories. To deal with these possibilities, in the present embodiment, an FFB, which is the logical block in which although invalid data is written up to the middle of the logical page, the remaining logical page is in the erased state as shown in FIG. 21, is adopted. In the FFB, additional writing is performed with respect to the remaining logical page. In the present embodiment, the FFB is adopted in the FS 12 and the IS 13. The invalid data in the FFB managed as the FS 12 and the IS 13 is the data being valid initially in the FS 12 and the IS 13, however, it is rewritten from the WC 21 to another place such as the MS 11 and becomes invalid in the logical block.

To realize the additional writing to the FFB, information (FFB management information managed in the FFB management table 310) for distinguishing the logical page (valid page) in which the data has been written after the erasing from an unused page in which the data has not been written is managed in the cluster block information table 33 shown in FIG. 7 for the respective logical blocks. It is required that the FFB management information is written into the NAND memory 10 to make the FFB management information nonvolatile so that the information can be used over the power off of the SSD 100.

However, when an incorrect power-off occurs while the data is written into an FFB and the FFB management information is written into the NAND memory 10 to make the information nonvolatile (commit), a problem occurs. Specifically, after the data is written into a certain logical page in the FFB having an unused page, when an incorrect power-off occurs before it is committed to the NAND memory 10 that the data has been written into the logical page in the FFB management information, at the time of starting the SSD next time, the FFB management information is in an unwritten state, although the data has been actually written into the FFB. In this state, the logical page is regarded as unwritten (unused) for management purposes, and hence, it is tried to write data newly in the logical page, and a writing error (data garbling) may occur.

Thus, at a point in time when the log or snapshot has been written into the NAND memory 10, the management table becomes nonvolatile. When an incorrect power-off sequence is performed before the log or snapshot is written into the NAND memory 10, the state of the management table returns to the point in time of the last commit at the time of next startup. It should be noted that although the state of the management table returns, an additional recording state of the FFB in the NAND memory 10 does not return.

Figure 22:
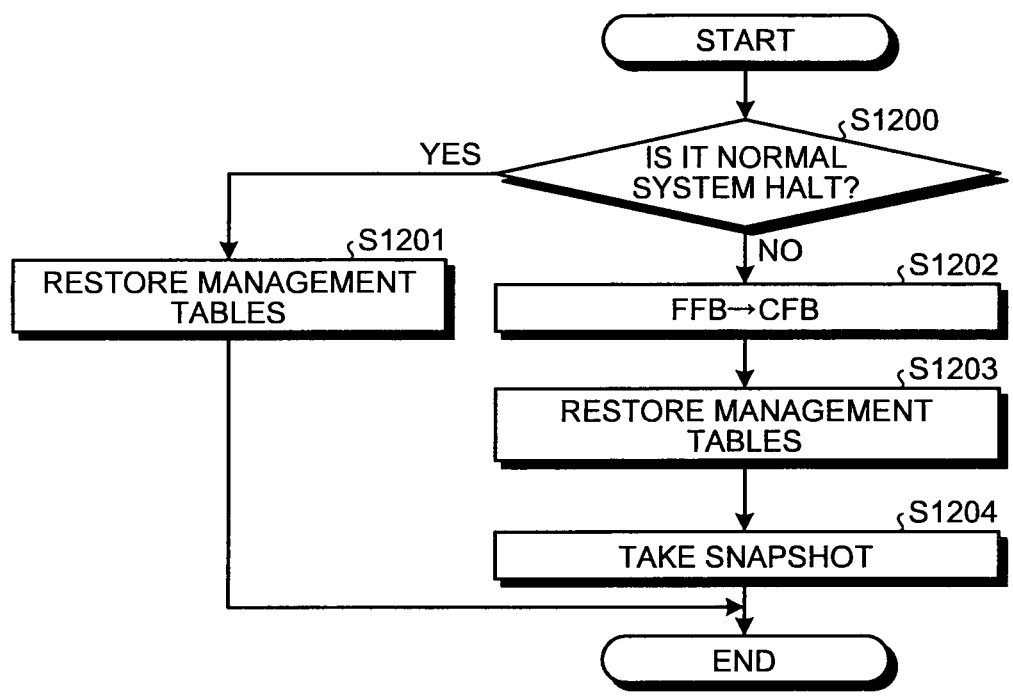
FIG. 22 is a flowchart illustrating processing performed by a data managing unit at the time of system startup.

FIG. 22 is a flowchart illustrating processing performed by the data managing unit 120 at the time of system startup.

The management-information restoring unit 214 detects at least one of the Active log, the difference log, and the Standby log in the NAND log 203 at the time of system startup, and judges whether the normal system halt is performed or an incorrect power-off is performed last time based on a recorded state of the Active log and the Standby log (Step S1200).

When judging that the normal system halt is performed (Yes at Step S1200), the management-information restoring unit 214 restores the management tables (the master table 204 and the DRAM log 205) based on the latest snapshot and difference log (Step S1201).

When judging that an incorrect power-off is performed (No at Step S1200), the management-information restoring unit 214 edits and changes these pieces of FFB management information such that when data is written next time, writing is performed after erasing the logical block. Specifically, the management-information restoring unit 214 executes processing for relocating all FFBs to a CFB, that is, processing for relocating all the logical blocks (logical block addresses) managed in the FFB management table 310 to under the control of the CFB management table 300 at the time of startup after the incorrect power-off. Accordingly, inconsistency between the writing state in the FFB and the FFB management information is solved (Step S1202).

After performing processing for relocating all FFBs to the CFB, the management-information restoring unit 214 restores the management tables (the master table 204 and the DRAM log 205) based on the latest snapshot and difference log (Step S1203).

The log reflecting unit 212 takes a snapshot again based on the master table 204 and the DRAM log 205 that are restored (Step S1204)

Because only the invalid data is stored in the FFB before additional recording, there will be no problem even when the logical block is relocated to the CFB and erased thereafter. Also in the case of a CFB, when an incorrect power-off occurs, inconsistency occurs between the management table and the state of the CFB in the NAND memory 10, and such a situation occurs that although data has been written in the CFB, the CFB management information is still in an unwritten state. However, because erasing is performed in the CFB immediately before the writing, the above-described writing error does not occur. Furthermore, when an incorrect power-off is detected, a snapshot is taken again, to return the nonvolatile information to a stable state.

In the present embodiment, detection of an incorrect power-off and resolution of inconsistency between the writing state in an FFB and the FFB management information are realized by adding the operating state managing unit 213 and the management-information restoring unit 214.

In the SSD 100 according to the present embodiment, before the first difference log after the system startup is recorded in the NAND log 203, the Active log indicating that the system is running is recorded in the NAND log 203, and the Standby log indicating that the system halts is additionally recorded in the NAND log 203 following the difference log at the time of normal system halt. At the time of system startup, it is judged whether normal system halt has been performed or an incorrect power-off has occurred last time, based on the recorded state of the Active log and the Standby log in the NAND log 203, thereby enabling to easily and reliably detect the incorrect power-off.

Moreover, in the SSD 100 according to the present embodiment, when an incorrect power-off is detected, because an FFB is relocated to under the control of a CFB, inconsistency between the writing state in the FFB and the FFB management information is resolved, and occurrence of the writing error can be prevented beforehand. Thus, it is possible to construct a memory system with high reliability using a NAND-type flash memory.

Second Embodiment

Figure 23:
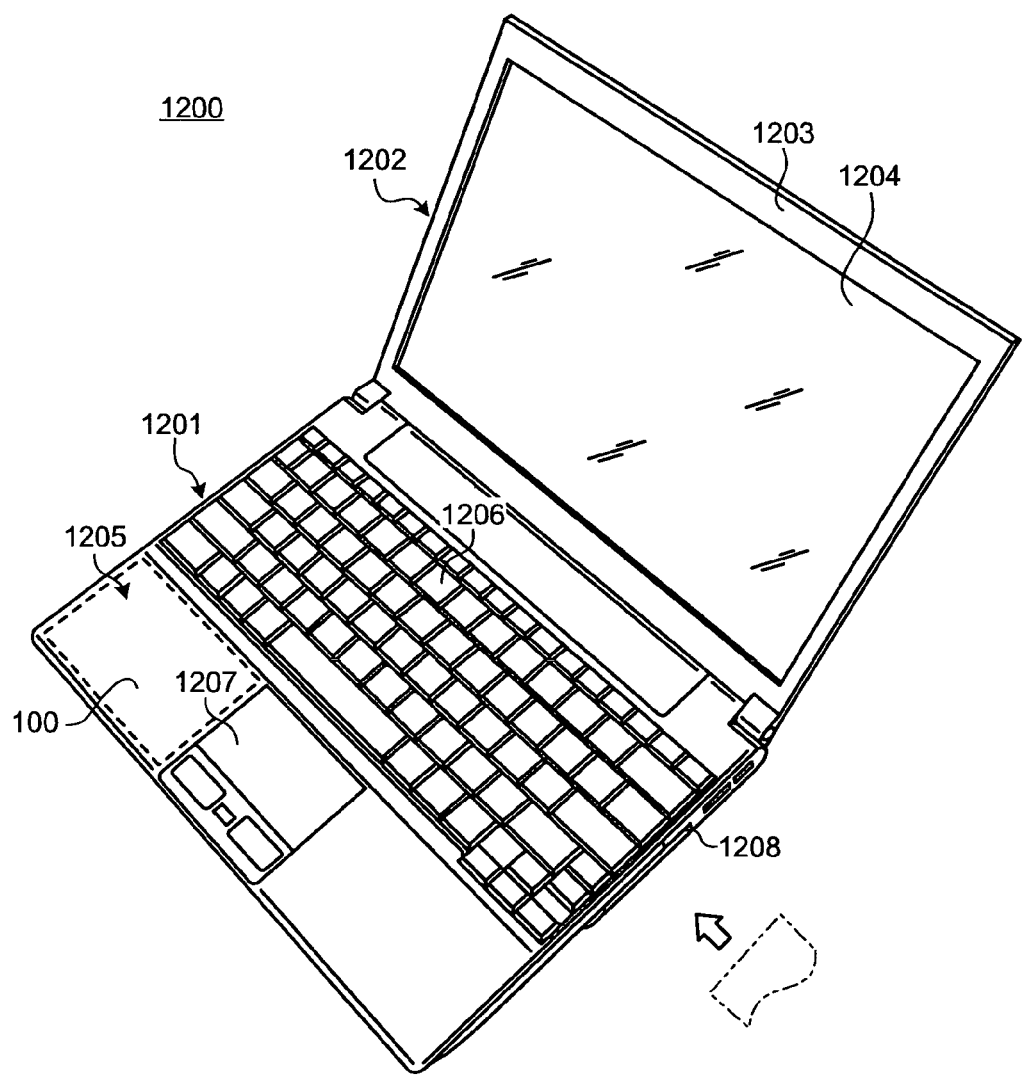
FIG. 23 is an overall view of a PC on which an SSD is mounted.

FIG. 23 is a perspective view of an example of a PC 1200 on which the SSD 100 is mounted. The PC 1200 includes a main body 1201 and a display unit 1202. The display unit 1202 includes a display housing 1203 and a display device 1204 accommodated in the display housing 1203.

The main body 1201 includes a chassis 1205, a keyboard 1206, and a touch pad 1207 as a pointing device. The chassis 1205 includes therein a main circuit board, an optical disk device (ODD) unit, a card slot, and the SSD 100.

The card slot is provided so as to be adjacent to the peripheral wall of the chassis 1205. The peripheral wall has an opening 1208 facing the card slot. A user can insert and remove an additional device into and from the card slot from outside the chassis 1205 through the opening 1208.

The SSD 100 can be used instead of a conventional hard disk drive (HDD) in the state of being mounted on the PC 1200 or can be used as an additional device in the state of being inserted into the card slot included in the PC 1200.

FIG. 24 is a diagram of a system configuration example of the PC 1200 on which the SSD 100 is mounted. The PC 1200 includes a CPU 1301, a north bridge 1302, a main memory 1303, a video controller 1304, an audio controller 1305, a south bridge 1309, a basic input/output system read-only memory (BIOS-ROM) 1310, the SSD 100, an ODD unit 1311, an embedded controller/keyboard controller IC (EC/KBC) 1312, and a network controller 1313.

The CPU 1301 is a processor for controlling an operation of the PC 1200, and executes an operating system (OS) loaded from the SSD 100 onto the main memory 1303. Furthermore, when the ODD unit 1311 is capable of executing at least one of read processing and write processing on a mounted optical disk, the CPU 1301 executes the processing.

Moreover, the CPU 1301 executes a system BIOS stored in the BIOS-ROM 1310. The system BIOS is a computer program for controlling a hardware of the PC 1200.

The north bridge 1302 is a bridge device that connects a local bus of the CPU 1301 to the south bridge 1309. The north bridge 1302 has a memory controller for controlling an access to the main memory 1303.

Moreover, the north bridge 1302 has a function of executing a communication with the video controller 1304 and a communication with the audio controller 1305 through an accelerated graphics port (AGP) bus and the like.

The main memory 1303 temporarily stores therein a computer program and data, and functions as a work area of the CPU 1301. The main memory 1303, for example, consists of a DRAM.

The video controller 1304 is a video reproduction controller for controlling the display unit 1202 used as a display monitor of the PC 1200.

The audio controller 1305 is an audio reproduction controller for controlling a speaker 1306 of the PC 1200.

The south bridge 1309 controls each device on a low pin count (LPC) bus 1314 and each device on a peripheral component interconnect (PCI) bus 1315. Moreover, the south bridge 1309 controls the SSD 100 that is a memory device storing various types of software and data through the ATA interface.

The PC 1200 accesses the SSD 100 in sector units. A write command, a read command, a flush command, and the like are input to the SSD 100 through the ATA interface.

The south bridge 1309 has a function of controlling an access to the BIOS-ROM 1310 and the ODD unit 1311.

The EC/KBC 1312 is a one-chip microcomputer in which an embedded controller for power management and a keyboard controller for controlling the keyboard (KB) 1206 and the touch pad 1207 are integrated.

The EC/KBC 1312 has a function of turning on/off the PC 1200 based on an operation of a power button by a user. The network controller 1313 is, for example, a communication device that executes communication with an external network such as the Internet.

The PC 1200 according to the second embodiment supplies power to the SSD 100 and also issues a halt request (a Standby request) to the SSD 100. Even when the power supply from the PC 1200 to the SSD 100 is incorrectly blocked, occurrence of a writing error can be prevented beforehand.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A memory system comprising:
a first storage unit that is volatile;
a second storage unit that is nonvolatile including a plurality of blocks, each one of the plurality of blocks being a data erasing unit and including a plurality of pages, each one of the plurality of pages being a data writing unit;
a read/write control unit that performs data reading from the second storage unit and data writing to the second storage unit based on a management table in which a logical address is associated with a data storage position in the second storage unit;
a log control unit that transfers the management table to the first storage unit, and when an event to update the management table on the first storage unit occurs, stores difference information before and after update of the management table as a difference log into the first storage unit;
a log reflecting unit that executes commit processing for storing the difference log into the second storage unit and reflecting the difference log in the management table stored in the first storage unit when a first condition is established;
an operating state managing unit that sequentially stores a first log, which indicates the system is in operation, into the second storage unit, the difference log into the second storage unit after the first log and after system startup, and a second log, which indicates that the system halts at a time of normal system halt, into the second storage unit after the difference log and when normal system halt is performed; and a management-information restoring unit that detects, via a processor, at least one of the first log, the difference log, and the second log stored in the second storage unit and judges whether normal system halt has been performed, wherein the plurality of blocks includes a first block in which writing is performed from a top page of the first block after performing an erasing operation and a second block in which invalid data is written up to a first area, the first area being composed of at least one page from a top page of the second block, writing is additionally performed to a page following the first area in the second block without performing the erasing operation, and the management-information restoring unit changes the management table, when judging that the normal system halt is not performed, to release the second block and use the released second block as the first block.

2. The memory system according to claim 1, wherein the log reflecting unit and the operating state managing unit additionally store the first log, the difference log, and the second log into a nonvolatile log area including blocks as a unit of data erasing in the second storage unit.

3. The memory system according to claim 2, wherein the operating state managing unit stores the first log into the nonvolatile log area, at any one point in time when initialization has finished, when activation is requested, or when data access is requested after the system startup.

4. The memory system according to claim 2, wherein the operating state managing unit stores the second log into the nonvolatile log area, when a system halt request is received from the host apparatus.

5. The memory system according to claim 4, wherein the operating state managing unit flushes data in the first storage unit to the second storage unit, when the system halt request is received from the host apparatus.

6. The memory system according to claim 1, wherein the management-information restoring unit judges that the normal system halt is not performed, when the second log is not stored in the second storage unit.

7. The memory system according to claim 2, wherein the management-information restoring unit judges that the normal system halt is not performed, when the second log is not stored at an end of the nonvolatile log area.

8. The memory system according to claim 1, wherein the first condition includes at least one of a case where an amount of the difference log stored in the first storage unit has reached a specific value and a case where update of the management table has reached to a point at which consistency is achieved.

9. The memory system according to claim 1, wherein the log control unit performs snapshot processing for storing the management table stored in the first storage unit into the second storage unit when a second condition is established.

10. The memory system according to claim 9, wherein the second condition includes at least one of a case where the normal system halt is performed and a case where a storage area of the difference log in the first storage unit becomes insufficient.

11. The memory system according to claim 1, wherein the log reflecting unit invalidates the difference log stored in the first storage unit after the commit processing has been performed.

12. The memory system according to claim 9, wherein the log control unit invalidates the difference log stored in the first storage unit after the snapshot processing has been performed.

13. A method of controlling a memory system that includes a first storage unit that is volatile and a second storage unit that is nonvolatile including a plurality of blocks, each one of the plurality of blocks being a data erasing unit and including a plurality of pages, each one of the plurality of pages being a data writing unit, the method comprising:

read/write control processing for performing data readout from the second storage unit and data writing to the second storage unit based on a management table in which a logical address is associated with a data storage position in the second storage unit;

log control processing for transferring the management table to the first storage unit, and when an event to update the management table on the first storage unit occurs, storing difference information before and after update of the management table as a difference log into the first storage unit;

log reflecting processing for executing commit processing for storing the difference log into the second storage unit and reflecting the difference log in the management table stored in the first storage unit when a first condition is established;

operating state managing processing for sequentially storing a first log, which indicates the system is in operation, into the second storage unit, the difference log is stored into the second storage unit after the first log and after system startup, and a second log, which indicates that the system halts at a time of normal system halt, into the second storage unit after the difference log and when normal system halt is performed; and management-information restoring processing for detecting, via a processor, at least one of the first log, the difference log, and the second log stored in the second storage unit and judging whether normal system halt has been performed, wherein the read/write control processing includes managing the second storage unit that includes a first block in which writing is performed from a top page of the first block after performing an erasing operation and a second block in which invalid data is written up to a first area, the first area being composed of at least one page from a top page of the second block, writing is additionally performed to a page following the first area in the second block without performing the erasing operation, and the management-information restoring processing includes changing the management table, when judging that the normal system halt is not performed, to release the second block and use the released second block as the first block.

14. The method according to claim 13, wherein the log reflecting processing and the operating state managing processing include additionally storing the first log, the difference log, and the second log into a nonvolatile log area including blocks as a unit of data erasing in the second storage unit.

15. The method according to claim 14, wherein the operating state managing processing includes storing the first log into the nonvolatile log area, at any one point in time when initialization has finished, when activation is requested, or when data access is requested after the system startup.

16. The method according to claim 14, wherein the operating state managing processing includes storing the second log into the nonvolatile log area, when a system halt request is received from the host apparatus.

17. The method according to claim 16, wherein the operating state managing processing includes flushing data in the first storage unit to the second storage unit, when the system halt request is received from the host apparatus.

18. The method according to claim 13, wherein the management-information restoring processing includes judging that the normal system halt is not performed, when the second log is not stored in the second storage unit.

19. The method according to claim 14, wherein the management-information restoring processing includes judging that the normal system halt is not performed, when the second log is not stored at an end of the nonvolatile log area.

20. The method according to claim 13, wherein the first condition includes at least one of a case where an amount of the difference log stored in the first storage unit has reached a specific value and a case where update of the management table has reached to a point at which consistency is achieved.

21. The method according to claim 13, wherein the log control processing includes performing snapshot processing for storing the management table stored in the first storage unit into the second storage unit when a second condition is established.

22. The method according to claim 21, wherein the second condition includes at least one of a case where the normal system halt is performed and a case where a storage area of the difference log in the first storage unit becomes insufficient.

23. The method according to claim 13, wherein the log reflecting processing includes invalidating the difference log stored in the first storage unit after the commit processing has been performed.

24. The method according to claim 21, wherein the log control processing includes invalidating the difference log stored in the first storage unit after the snapshot processing has been performed.

* * * * *